United States Patent
Rohleder et al.

(10) Patent No.: US 11,016,768 B2
(45) Date of Patent: May 25, 2021

(54) HARDWARE SUPPORT FOR OS-CENTRIC PERFORMANCE MONITORING WITH DATA COLLECTION

(71) Applicant: NXP USA, Inc., Austin, TX (US)

(72) Inventors: Michael Rohleder, Unterschleissheim (DE); George A. Ciusleanu, Marasesti (RO); Frank Steinert, Rosenheim (DE)

(73) Assignee: NXP USA, Inc., Austin, TX (US)

(*) Notice: Subject to any disclaimer, the term of this patent is extended or adjusted under 35 U.S.C. 154(b) by 104 days.

(21) Appl. No.: 16/431,124

(22) Filed: Jun. 4, 2019

(65) Prior Publication Data
US 2020/0319884 A1 Oct. 8, 2020

(30) Foreign Application Priority Data
Apr. 3, 2019 (RO) .............................. a 2019 00215

(51) Int. Cl.
*G06F 9/30* (2018.01)
*G06F 11/34* (2006.01)
*G06F 30/35* (2020.01)

(52) U.S. Cl.
CPC ...... *G06F 9/30101* (2013.01); *G06F 11/3419* (2013.01); *G06F 30/35* (2020.01)

(58) Field of Classification Search
CPC .......................... G06F 11/3419; G06F 9/30101
See application file for complete search history.

(56) References Cited

U.S. PATENT DOCUMENTS

| | | | |
|---|---|---|---|
| 5,657,253 A | 8/1997 | Dreyer et al. | |
| 6,446,029 B1 | 9/2002 | Davidson et al. | |
| 10,120,712 B2 | 11/2018 | Singer et al. | |
| 10,120,713 B2 | 11/2018 | Rohleder et al. | |
| 10,596,380 B2* | 3/2020 | Levin | A61N 1/368 |
| 2003/0036883 A1 | 2/2003 | Mericas | |
| 2012/0227045 A1* | 9/2012 | Knauth | G06F 9/3004 |
| | | | 718/100 |
| 2015/0254017 A1 | 9/2015 | Soja et al. | |

(Continued)

FOREIGN PATENT DOCUMENTS

KR 101151638 B1 6/2012

OTHER PUBLICATIONS

Christoph Ficek et al., Applying the AUTOSAR timing protection to build safe and efficient ISP 26262 mixed-criticality systems, Oct. 29, 2013.

(Continued)

*Primary Examiner* — Zachary K Huson

(57) ABSTRACT

A system, method, apparatus and integrated circuit are provided for collecting runtime performance data with a set of hardware timers under control of a dedicated hardware control register by connecting a central processing unit (CPU) and memory to a timer block bank having a plurality of timer instances which are selectively enabled and activated to collect runtime performance data during execution of application code by measuring specified software execution events, where the dedicated hardware control register includes a plurality of register fields for independently controlling activation behavior of the plurality of timer instances in response to a single write operation to all register fields in the hardware control register.

21 Claims, 9 Drawing Sheets

(56) References Cited

U.S. PATENT DOCUMENTS

2017/0116418 A1* 4/2017 Shanmugavelayutham ................
G06F 21/566

OTHER PUBLICATIONS

Dominique Bertrand et al., An analysis of the AUTOSAR OS timing protection mechanism, IEEE 2009.
Vector, High-Rate Rask Scheduling within AUTOSAR, Technical Article, Jul. 2015.
AUTOSAR, Overview of Functional Safety Measures in AUTOSAR, Document ID 664, Release 4.3.0, 2016 https://www.autosar.org/fileadmin/user_upload/standards/classic/4-3/AUTOSAR_EXP_FunctionalSafetyMeasures.pdf.
AUTOSAR, Specification of Operating System, V3.1.1, R3.1 Rev 0002, Document ID 034, 2009 https://www.autosar.org/fileadmin/user_upload/standards/classic/3-0/AUTOSAR_SWS_OS.pdf.
Rohleder et al., U.S. Appl. No. 16/428,058, filed May 31, 2019, entitled Hardware for Supporting OS Driven Load Anticipation Based on Variable Sized Load Units.

* cited by examiner

HARDWARE SUPPORT FOR OS-CENTRIC PERFORMANCE MONITORING WITH DATA COLLECTION

BACKGROUND OF THE INVENTION

Field of the Invention

The present invention is directed in general to field of microcontroller devices and methods of operating same. In one aspect, the present invention relates to a method, apparatus, system and software architecture for automotive electronic control units (ECUs).

Description of the Related Art

With increasingly complex computer systems, the ability to observe and track the execution performance of different tasks or other elements of software is complicated by the complex interactions of different components in the computer system, as well as the overhead and complexity of additional hardware and software that is required to provide such observation functionality. For example, integrated circuit computer systems, such as microcontrollers (MCUs), System(s)-on-a-Chip (SoC), and System(s)-in-a-Package (SiP), contain one or more central processing units (CPUs) for executing software instructions. Having the ability to concurrently run multiple CPUs, it is becoming increasingly important to be able to ensure a proper operation of the related software execution, especially when blockages due to the usage of shared resources or other limitations may lead to an incorrect behavior. The common and widespread utilization of real-time operating systems (RTOSes), which permit a quasi-concurrent execution of multiple software tasks by one or several scheduling algorithms, usually interspersed with the execution of interrupt service routines, further complicates related scenarios since the execution of a task may actually be stalled by other tasks, interrupt service routines, etc. In addition, blockages due to the definition of critical sections (or to the usage or locking of resources) provide a further complexity that is not easy to manage. This makes the observation of processing performance, as well as related mechanisms that are intended to ensure an appropriate behavior, a complicated effort that often requires itself a significant processing overhead. Especially when real-time performance is a concern, such an overhead is an issue. As seen from the foregoing, the existing computer system design and operations solutions are extremely difficult at a practical level by virtue of the challenges of providing a software execution observation and deadline monitoring capability that can observe software execution and stall conditions and provide violation or error handling reporting which correctly identifies the root cause of misbehavior without imposing excessive overhead and complexity of additional hardware and software required to provide observational functionality during microcontroller operations.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A high-performance and cost-effective control system, apparatus, architecture, and methodology are described in which a monitoring hardware circuit includes a set of hardware observation timer and watchdog elements controlled by a single performance monitor control register to monitor (OS) runtime performance data, such as task execution or stall time or task subsection related timing. The performance monitor control register may also be utilized to monitor execution or stall time behavior related to an interrupt service routine or to the usage or locking of a hardware or software resource. By providing the performance monitor control register with one or more write-1-clear (W1C) fields which are each capable to control a single or multiple watchdog and timer processing functions with a single write operation to the performance monitor control register, the monitoring hardware circuit provides a timing protection mechanism for collecting related runtime information during execution of application code while avoiding unnecessary impact on application code and minimizing the overhead for collecting runtime performance data. In this context, the specific combination of write-1-clear fields enables a selective control of multiple timing and/or observation measurement behaviors. The number of related timing/observation measurements is defined by the number of timer instances made available for this purpose and can be controlled by the performance monitor control register.

Alternatively or in addition, with a direct memory access (DMA) engine working in the background to load and store counter values of the timer elements, different measurements can be started and stopped, thereby enabling the disclosed monitoring hardware circuit to be scalable to handle multiple observations or measurements that may occur in an OS. In selected embodiments, runtime performance data collected by the observation timer and watchdog elements may be used to identify task(s) and/or sub-section(s) of a task which may require some specific timing observation (e.g., a critical section, which impacts the response time of an interrupt service routine). By observing corresponding timing requirements with minimum impact (a single write operation for every change in observation functionality), the correct behavior of associated software features can be observed and asserted. In case of a violation, an appropriate error indication can be provided as an effect of this observation.

Figure 1:
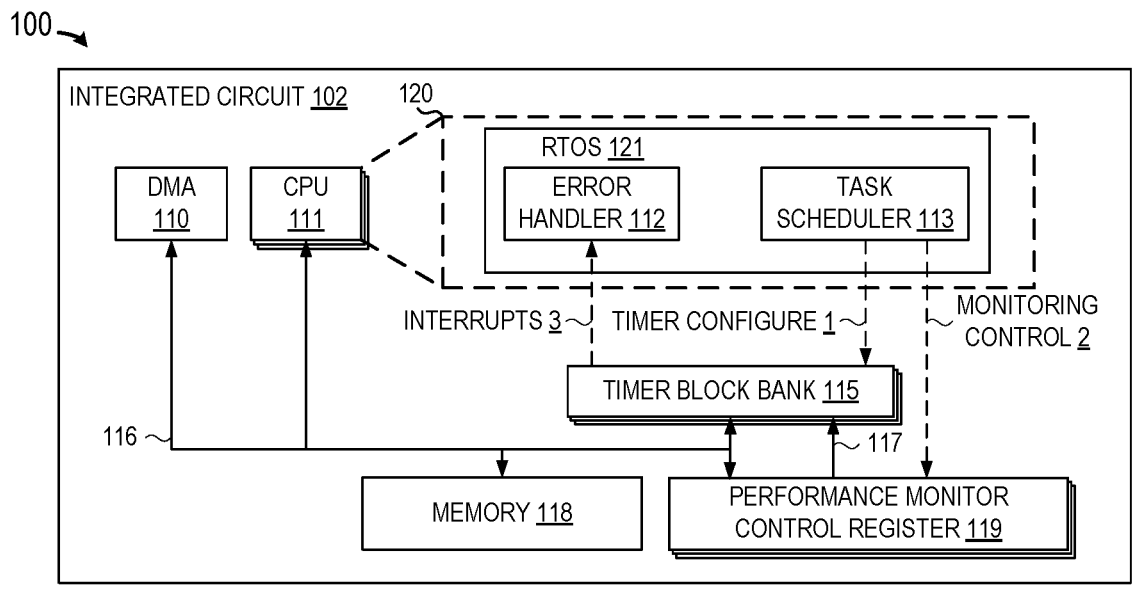
FIG. 1 is a block diagram illustration of an integrated circuit in which a performance monitor control register is connected to efficiently provide software control of a timer block bank which provides timer and watchdog observation functionality in accordance with selected embodiments of the present disclosure.

To provide additional details for an improved understanding of selected embodiments of the present disclosure, reference is now made to FIG. 1 which is a simplified block diagram illustration of a computer system 100 having an integrated circuit 102 in which a software-controlled performance monitor control register 119 is connected to efficiently control a timer block bank 115 which provides timer and watchdog functionality. As will be appreciated, the integrated circuit 102 may be any device, such as a microcontroller (MCU) or system-on-chip (SoC), which executes an operating system. As disclosed herein, the integrated circuit 102 may include one or more CPUs 111, internal memory 118, and other peripheral devices, such as a DMA controller 110, a timer block bank 115 consisting of one or more timer blocks that are connected to and controlled by performance monitor control register 119, all connected via one or more communication bus lines 116, 117. In particular, a first communication bus line 116 may provide a switch fabric connection between DMA 110, CPU 111, timer block bank 115, memory 118, and performance monitor control register 119. In addition, a second communication bus line 117 may provide a separate, dedicated communication line for providing control signal information from the performance monitor control register 119 to the timer block bank 115.

As indicated by dashed lines, the CPU 111 is shown to be executing software 120, that may include an operating system or a real-time operating system (RTOS) software 121 comprising several modules (e.g., error handler 112, task scheduler 113 etc.) that issues and receives software control signals and commands 1-3, thus interacting with the hardware elements. In selected embodiments, the integrated circuit 102 may be configured to run one or more operating systems to support the computer's basic functions, such as scheduling tasks, executing applications, and controlling peripherals. In operation, an operating system enables multitasking in which several different tasks appear to be running concurrently on the same CPU 111, even though the CPU 111 is only executing instructions of a single task at any given point in time. The appearance of simultaneous task execution is provided by switching between tasks, often before a particular task has completed. The term real-time operating system refers to an operating system intended to serve real-time applications that process data as it comes in, typically without buffer delays. A task switch can be carried out without requiring cooperation from the task being stopped and with the intention to subsequently resume execution of the stopped task. To enable task switching, the state information, or execution context data, for an executing task can be stored for future use. The state information can include, among other things, CPU register contents and the stack. In selected embodiments, a task may be a unit of execution or a unit of work and may include a set of instructions that can be executed by a CPU.

The software 120 may, in selected embodiments, comprise an operating system that is embodied as a real-time operating system (RTOS) module 121 which is constrained by the amount of time it takes to accept and complete a task. This type of operating system is particularly useful in MCUs that have critical timing requirements, such as with embedded systems used in automobiles. While the present disclosure is provided with reference to an example computer system executing an RTOS, it will be understood the present disclosure is not necessarily limited to such systems, and may be applied to improve any computer system functionality by providing a specific hardware monitoring circuit and associated performance monitor control register data structure for efficiently collecting runtime performance data that can be used to improve the way the computer system stores and retrieves data in memory.

As disclosed herein, the RTOS module 121 enables improved functionality by efficiently programming the performance monitor control register 119 to control a set of timer and/or watchdog elements in the timer block bank 115 for monitoring task-related execution or stall/miss time during code execution. In particular and as described more fully hereinbelow, the RTOS module 121 may be configured to write timer configuration info 1 which set up one or more timer/watchdog control registers in the timer block bank 115 so as to be enabled (but not started) and to define time budget(s) and behavior for the timer/watchdog elements. With the timers and watchdogs in the timer block bank 115 enabled, the RTOS module 121 may be configured to write monitoring control info 2 to the performance monitor control register(s) 119 which, in turn, control the activation of the timer/watchdog elements in the timer block bank 115 to monitor the execution and stall times for specified tasks. When activated, the timer/watchdog elements in the timer block bank 115 use an input clock (not shown) to start monitoring one or more related tasks/or sub-sections of a task during runtime the OS code. In embodiments where the RTOS module 121 monitors execution or miss times, the RTOS module 121 may generate the monitoring control info 2 in response to related trigger events (e.g., start of a sub-section or finishing a sub-section which may be a critical section within a task). Additional hardware trigger signals may provide further input; e.g., to distinguish a stall condition due to missing info from a normal execution. And in embodiments where the RTOS module 121 monitors task execution or stall times, the RTOS module 121 may generate the monitoring control info 2 in response to task switch events and interruptions of task executions provided by the OS task scheduler.

As a result of the monitoring control info 2 being written to control fields in the performance monitor control register 119, the selected timer and/or watchdog elements in the timer block bank 115 are selectively activated and deactivated to measure the execution or stall/miss time spent for the identified task or sub-task segment. Other timers are not modified in their operation, keeping an activated timer activated, and keeping a deactivated one deactivated. Output results from the timers may be written as output values for storage as runtime performance data and/or may be issued as (error) interrupts 3 to an error/interrupt handler 112. The later processing occurs under hardware control in case a watchdog element or observation timer detects an event that indicates a watchdog expiration or exceeding a budget value, and subsequently issues an error interrupt or notification interrupt 3. In this way, the RTOS module 121 and associated hardware monitoring circuit 115, 119 may be used to collect budget information for different tasks or sub-sections of a task.

The timing/observation measurement functionality disclosed herein permits a fine-grained observation of task execution or sub-sections of a task (e.g., a critical section) having tight timing requirements with a minimum software-hardware interaction, thus reducing the impact of such an observation on the observed software. Integrated circuits (ICs), like MCUs or SoCs, usually include peripherals, which perform specific tasks that could be controlled by software instructions executing on CPUs by accessing a register interface. Peripherals usually implement functionality that is easy to be implemented in hardware or cannot be implemented within software, thereby freeing the CPU's resources to execute instructions of more important tasks, which in turn enhances MCU real-time performance. An example peripheral for the IC 102 is the direct memory access (DMA) controller 110 which may be a hardware that allows a peripheral input/output (I/O) device to send or receive data directly to or from the main memory, bypassing the CPU 111 to speed up the corresponding memory operations. The IC may include other peripherals, such as one or more timer blocks in timer bank 115. Peripherals, such as a timer block, usually implement their tasks after they are programmed by a CPU. In most cases, software executing on a CPU 111 programs peripherals by writing control values, time values, etc., to peripheral control registers. These values define the behavior of the peripheral when performing its task(s). Programming peripherals is a time-consuming and complicated process, but once programmed, peripherals work alone to implement their tasks. In other words, programmed peripherals can perform their tasks concurrently while the CPU executes unrelated instructions. This is in particular the case for the timer instances implemented by the timer block bank 115.

Despite the preferable independence of operations of these timer instances from the software execution, the observation of software execution (e.g., the execution of a software task, a subsection of an application or an interrupt service routine) requires some notification about a change to start and stop a corresponding observation or measurement. Unless there is an event available for this purpose within the hardware that can be utilized for this purpose by a timer (which is very unlikely, since these are software execution related events), this requires at least one interaction between the software and a hardware timer element, such as a register access by software. Indeed, such changes may relate to multiple elements of the software execution. For example, a task switch from an earlier executed task to a new task involves two tasks, the earlier task and the new task). In addition, a task switch caused by the preemption of a lower priority task by a higher priority task also involves two tasks where the measurement of the first task is not concluded. In addition, an interrupt service routine (ISR) which interrupts an application involves the normal execution and the execution of the ISR. Similarly, an interrupt service routine which interrupts a lower priority interrupt service routine involves two interrupt service routines, where the earlier one will usually have interrupted some normal software execution. When multiple elements are involved, a corresponding observation or measurement capability must be operable to concurrently modify (e.g., stop an observation while starting another one) or not modify (e.g., when the observation shall include the new execution, such as with the case of an interrupt or a preemption by a higher priority task) the behavior of at least two and preferable multiple timer instances.

Figure 2:
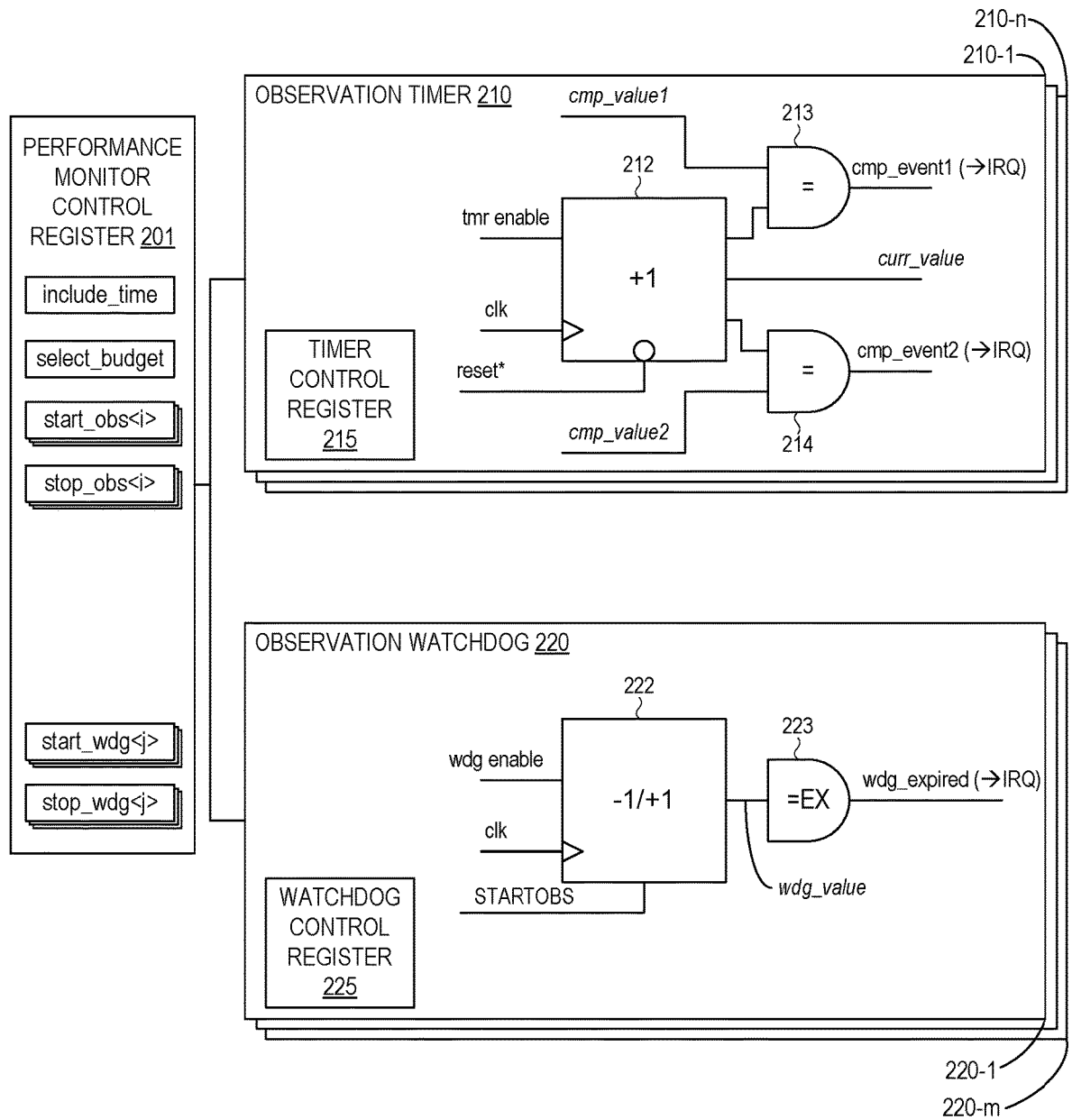
FIG. 2 is a block diagram of a monitoring hardware circuit which includes a performance monitor control register connected to control a set of timer and watchdog elements for collecting runtime performance data in accordance with selected embodiments of the present disclosure.

To provide additional details for an improved understanding of selected embodiments of the present disclosure, reference is now made to FIG. 2 which is a block diagram of a monitoring hardware circuit 200 for collecting runtime performance data for a multiplicity of software executions. As depicted, the monitoring hardware circuit 200 comprises a performance monitor control register 201 connected with a first set of n observation timer elements 210 and a second set of m observation watchdog elements 220 for collecting runtime performance data. Every observation timer element 210 employs a timer control register 215 to control the setup and activation this element. Every observation watchdog employs a watchdog control register 225 to control the setup and activation this element. In particular, the timer control register 215 and the watchdog control register 225, respectively, specify control register values to configure and enable the corresponding timer/watchdog element 210, 220, and the performance monitor control register 201 specifies control register values to control the activation of all selected timer/watchdog elements 210, 220 for monitoring operations. For this purpose, the control register values 215, 225 many enable or disable the usage of a timer/watchdog element, either independently (as a standalone timer/watchdog) or under control of the performance monitor control register. In the latter case, the monitoring hardware circuit 200 is operative to observe and measure the amount of execution and/or stall time for tasks or sub-sections of a task with minimum overhead at the corresponding granularity level. For this purpose, corresponding measurement criteria is configured within the timer/watchdog control register 215,225 while the measurement control is performed by the performance monitor control register 201 concurrently for all selected timer/watchdog elements; which enables an efficient control mechanism with minimum observation overhead.

The depicted monitoring hardware circuit 200 includes a set of n timer elements configured as observation timers 210-1 to 210-n for collecting task or sub-section related execution and stall information and providing the capability to generate at least one interrupt (e.g., by forwarding a corresponding comparison event cmp_event1, cmp_event2 as an interrupt signal to an interrupt controller) when one of these timer elements 210 exceeds its budget (e.g., by utilizing such events, like a WARNING interrupt and a later ERROR interrupt, for every timer). In selected embodiments, the n timer elements may include paired timers to include further execution status information that is available within the IC 102 (e.g., an execution stall indication provided by the CPU 111, or another element within the system), including a first execution timer (ETIMER) which is configured to measure the execution time (covering an observation having an asserted execution status) of a task or sub-section and a second stall timer (STIMER) which is configured to measure the stall or miss time (covering an observation having a de-asserted execution status) of a task or sub-section. Such a pair of measurement timers is an ideal instrument to combine aspects of software execution measurement with some hardware status information (usually provided in form of a status signal), permitting a fine granular measurement of a corresponding software execution.

Each observation timer 210 may include a timer control register 215 which stores timer control info, such as a timer enable control (timer_enable), a timer clock source selection (timer_clksrc), a timer stop value (timer_stop), and one or more timer behavior values. In addition, each observation timer 210 is connected to receive a timer/count enable signal (tmr enable) to enable control by performance monitoring software and/or hardware status indication in the observation timer 210. Each observation timer 210 also includes a timer or counter circuit 212 which is connected to count clock pulses from an input clock (e.g., clk, where a particular clock may be selected in accordance with the timer clock source selection timer_clksrc) in response to being enabled by the timer/count enable signal (e.g., tmr enable). For example, the timer/counter circuit 212 may be an upwards counting multi-bit (e.g., 24 bit) timer element which may be reset (e.g., 0) in response to a reset signal (e.g., reset*) or reloaded to a start value (not shown). The reset signal may be set under software control, such as when there is a task switch event, or under hardware control, such as when an associated trigger event is provided. During enabled timer operations, the timer/counter circuit 212 generates a current timer output value (e.g., curr_value) which may be provided by another timer register (not shown). In addition, the timer/counter circuit 212 may be connected to provide the counter output (e.g., curr_value) to k event comparator elements 213, 214 (e.g., a set of XOR gates summarized by an OR gate which is implementing an equal comparison), each of which is connected for comparison with a compare value (e.g., cmp_value1, cmp_value2) specified in the timer control register 215 or other storage memory. As a result, whenever the timer 212 reaches the value specified by an enabled comparator (e.g., 213), the associated event/request signal (e.g., cmp_event1) is raised and may be sent to the interrupt control logic (IRQ).

As disclosed herein, the timer/count enable signal (e.g., tmr enable) may be generated in response to the setting (or resetting) of control field values stored in the control registers. For example, individual timers may be activated and deactivated by writing register interface values (i.e., control fields start_obs<i>, stop_obs<i>) in the performance monitor control register 201, thereby generating the timer/count enable signal (tmr enable) directly (e.g., from the field stop_obs<i>). Alternatively, a pair of timers may be directly controlled by set of field pairs (include_time<k>, sel_budget<k>) in the performance monitor control register 201, wherein a first selection value (e.g., include_time) is used to enable a measurement, and a second selection value (e.g., select_budget) is used for selecting the timer for the measurement; the combination of both field values (e.g., combined by an AND gate) may then be used to derive the control signal tmr enable. Alternatively, one or both selection values (e.g., the signal select_budget) may be provided by a hardware status signal, permitting a measurement of software execution in combination with some hardware status. Alternatively or in addition, this may be further combined with a selection of an observation window for a timer instance (i.e., by control fields start_obs<i>, stop_obs<i> providing an Enable condition as later described in FIG. 3 that can be combined by an AND gate with such a selection) to generate a corresponding control signal tmr enable for a specific timer during an observation window defined by the software execution, which may then also include the measurement of some related hardware status information.

The depicted monitoring hardware circuit 200 also includes a set of m timer elements configured as observation watchdogs 220-1 to 220-m for checking against a specific time budget while monitoring specified task or sub-section related operations within an observation window to provide the capability to generate at least one interrupt (e.g., wdg_expired) when one of these watchdog elements 220 exceeds its budget. Each observation watchdog 220 may include a watchdog control register 225 which stores watchdog control values, such as a timer enable control (timer_enable), a timer clock source selection (timer_clksrc), a reload value, and one or more watchdog behavior values. In particular, each observation watchdog 220 may be connected to receive a watchdog/count enable signal (e.g., wdg enable) in response to task switch logic provided by the control registers (e.g., the stop_wdg<j> bit in the performance monitor control register 201). For example, individual watchdogs that have been enabled may be activated and deactivated by writing register interface values (start_wdg<j>, stop_wdg<j>) to the performance monitor control register 201, thereby generating the timer/count enable signal (wdg enable) for a particular watchdog instance 220-i. Each observation watchdog 220 also includes a timer or counter circuit 222 which is connected to count clock pulses from an input clock (e.g., clk, where a particular clock may be selected in accordance with the timer clock source selection timer_clksrc) in response to being enabled by the watchdog/count enable signal (e.g., wdg_enable). For example, the timer/counter circuit 222 may be implemented as a downwards counting multi-bit (e.g., 24 bit) timer element which may be (re)loaded with a specified timer reload value in response to a reload signal (e.g., STARTOBS). The reload value may be set under software control by writing a reload value in the watchdog control register 225 or other storage memory or being hardwired. During enabled watchdog operation, the timer/counter circuit 222 may be configured to generate a decrementing current timer output value (e.g., wdg_value) which may be provided by another timer register (not shown). In other embodiments, the timer/counter circuit 222 may be implemented as an upwards counting multi-bit timer element; for such an embodiment, the reload value will be usually 0, and the reset input can be utilized as reload signal (STARTOBS). In addition, the timer/counter circuit 222 may be connected to provide the timer output (e.g., wdg_value) to a comparator element 223 (e.g., a set of XOR gates summarized by an OR gate which is implementing an equal comparison) for comparison with an expiration value EX, such as a "0" value (which permits to avoid the usage of XOR gates, and will be typically used for a downwards timer/counter) or another reload value (which requires XOR gates, but may compare against an arbitrary value EX defined within the watchdog control register 225). As a result, whenever there is a matching wdg_value provided on the output of the timer/counter circuit 222, a "watchdog expired" signal (e.g., wdg_expired) is asserted and may be sent to the interrupt control logic (IRQ).

In a standalone mode specified by setting a control bit (e.g., STANDALONE) in the watchdog control register 225, the selected watchdog works independently (in standalone mode) from the performance monitor control register 201, and can therefore be used for other purposes than observing runtime performance data. In this standalone mode, the timer/counter circuit 222 can be enabled directly by providing the watchdog/count enable signal (e.g., wdg_enable) from the watchdog control register 225. When not in standalone mode (as specified by resetting the STANDALONE control bit), the selected watchdog is controlled by the performance monitor control register 201. In this mode, counting by the timer/counter circuit 222 is enabled upon asserting the watchdog/count enable signal (e.g., wdg_enable) from the performance monitor control register 201, and is activated or started (indicated by an assertion of STARTOBS) by setting or resetting an associated start flag, such as by writing a "one" to a set bit in a write-1-clear field (e.g., start_wdg<j>) in the control register 201, thereby clearing the start_wdg<j> value. Deasserting the timer count enable signal (wdg_enable) to the timer/counter circuit 222 halts the timer 222 in both modes. When starting the timer/counter circuit 222, a start value (ST) is loaded or hardwired into the timer/counter circuit 222 from the watchdog control register 225 or other storage memory by asserting the STARTOBS signal. When configured for downward counting, the timer/counter circuit 222 is stopped upon detecting a zero transition at the watchdog output wdg_value, thereby setting or resetting an associated expired flag wdg_expired. In addition, the timer/counter circuit 222 may be stopped by writing a "one" to a set stop bit in a write-1-clear field (e.g., stop_wdg<j>) in the control register 201, thereby clearing the stop bit value (stop_wdg<j>) and resetting the timer count enable signal (wdg_enable).

The depicted monitoring hardware circuit 200 also includes a performance monitor control register 201 which provides a control interface for monitoring runtime performance data by programming register interface values to control the operation of up to m+n observation windows with n observation timers 210 and m watchdog elements 220. The m+n observation windows may be assigned to measure the duration of a software execution (e.g., the execution time or the stall condition for a current task, section of an application software, or interrupt service routine) in combination with up to m observation windows being observed by one of the watchdog elements 220. As illustrated, the performance monitor control register 201 includes a first group of register values (include_time, select_budget, start_obs<i>, and stop_obs<i>) which may be used to control the n timer elements 210, and also includes a second group of register values (start_wdg<j>, and stop_wdg<j>) which may be used to control the m watchdog elements 220. This is a generalized description of a performance monitoring control register PERF_MON for a selected preferred embodiment. As will be appreciated, other embodiments may implement a performance monitoring control register PERF_MON that provides a different set of control bits, or a different form of control features; these alternatives are described for corresponding observation features in the description of later figures.

As disclosed herein, the control registers 201, 215, 225 are used to set up and control the activation of the observation timer and watchdog elements 210, 220 by storing control register field values that are used for generating or controlling control signals (e.g., tmr enable, reset*, and wdg_enable, STARTOBS) in response to control register field values and/or changes to the control register field values. Based on register interface values stored in the timer control register 215, 225, control signals are generated and applied to select any combination of these processing elements and to configure the corresponding timer functionality (e.g., execution timer, stall timer, or no timer). In hardware, a timer or watchdog element may be activated for observation by updating the start and stop bit register interface values (START_OBS<i>=1, STOP_OBS<i>=0) in W1C fields of the performance monitor control register 201 after enabling the timer or watchdog element by writing appropriate setup information into the corresponding timer/watchdog control register 215, 225. In addition or in the alternative, each observation timer 210 may be directly controlled with a set of field pairs (e.g., include_time, select_budget) or hardware status signals (not shown), such that the related observation timer 212 is enabled for observation when a specific set of these selection fields is set or cleared (e.g., include_time="1", select_budget may be utilized to select a particular timer instance), but is disabled by resetting a specific selection field (e.g., include_time). In similar fashion, a watchdog for a particular time window may also be controlled during setup by writing register interface values (e.g., cmp_value_1, cmp_value_2, reload, timer_reload) to the watchdog control register 225.

Once enabled, the observation timer and watchdog elements 210, 220 may then be activated in response to register interface values stored in the performance monitor control register 201. For example, a timer or watchdog element may be activated to start a time or watchdog measurement for the duration of a task by writing a specific start pattern to the control bits corresponding to a particular feature in the performance monitor control register 201. In particular, an observation watchdog may be activated by generating a STARTOBS pulse signal in response such an activation pattern, which will load the start value into the corresponding timer/counter element 222. The corresponding start value ST may be either a hardwired constant (e.g. 0, which allows to utilize the reset input as STARTOBS signal) or a specific multi-wire reload value that may be provided by the watchdog control register 225. The upwards/downwards counting of the timer/counter circuit may then be activated by asserting a corresponding count enable signal wdg_enable. Conversely, deasserting this signal wdg_enable will deactivate the count functionality of the timer/counter circuit. This deactivation may be triggered by writing a specific deactivation pattern into the performance monitor control register 201.

As disclosed herein, software overhead and control operations for monitoring runtime performance data with multiple timer and watchdog elements may be reduced by constructing selected control fields in a performance monitor control register 201 to receive interface values with a single write operation, thereby avoiding the need for any read-modify-write or a multiplicity of update operations. For example, the performance monitor control register 201 may include control fields for starting a first timer observation window (e.g., start_obs_1) and stopping the first timer observation window (e.g., stop_obs_1) which are implemented as Write-1-Clear (W1C) fields which are operative to clear an earlier set bit by writing a "one" value to a corresponding field, where any other write value (e.g., writing a 0 to any earlier bit, or writing a 1 to an earlier cleared bit) does not alter such a bit field. In addition, related control fields in the performance monitor control register 201 may be effectively paired such that clearing a first control bit (e.g., by writing a "1" to a set start_obs_1 bit that is implemented as write-1-clear field) also sets the associated second control bit (e.g., flipping the start_obs_1 bit from 1 to 0 sets the associated stop_obs 1 bit that is also implemented as write-1-clear field). A corresponding state change may be associated with an internal functionality of the timer (e.g., starting the first timer observation window). Conversely, clearing the second control bit (e.g., by writing a "1" to a set stop_obs_1 bit that is implemented as write-1-clear field) may also set the associated first control bit (e.g., flipping the stop_obs_1 bit from 1 to 0 sets the associated start_obs_1 bit that is also implemented as write-1-clear field). Any control bit may also be directly utilized to control a timer/watchdog functionality. For example, the value of the stop_wdg_1 bit may be used to drive the wdg_enable signal, thereby activating the first timer/watchdog when this bit is set and deactivating it when it is cleared, which effectively forms an observation window for this timer/watchdog. Stated more generally, the operation of paired W1C start and stop fields (START_OBS<i> and STOP_OBS<i>) in the performance monitor control register 201 is such that clearing the corresponding bit (by writing a "1") will either start or stop the corresponding observation window and also set the adverse bit. In similar fashion, the control register fields for starting and stopping a watchdog element (e.g., START_WDG<j> and STOP_WDG<j>) may be implemented as paired W1C register bits for the m observation watchdogs 220 that are operative to start and stop the observation by the corresponding watchdog. In this paired arrangement of W1C control register fields for the watchdog timers, the default or starting values for each enabled watchdog element are START_WDG<j>=1 and STOP_WDG<j>=0. Subsequently, writing a "1" to the START_WDG<j> bit causes it to be reset and also sets the STOP_WDG<j> bit, thereby activating the watchdog. And when a "1" is subsequently written to the STOP_WDG<j> bit, this causes it to be reset and also sets the START_WDG<j> bit, thereby deactivating the watchdog. In addition, a corresponding timer/watchdog may be completely disabled such that it cannot be activated by utilizing the control bit combination 00 (START_OBS<i>/STOP_OBS<i>=0) as control state for a timer/watchdog that is not (yet) or not properly setup.

Figure 3:
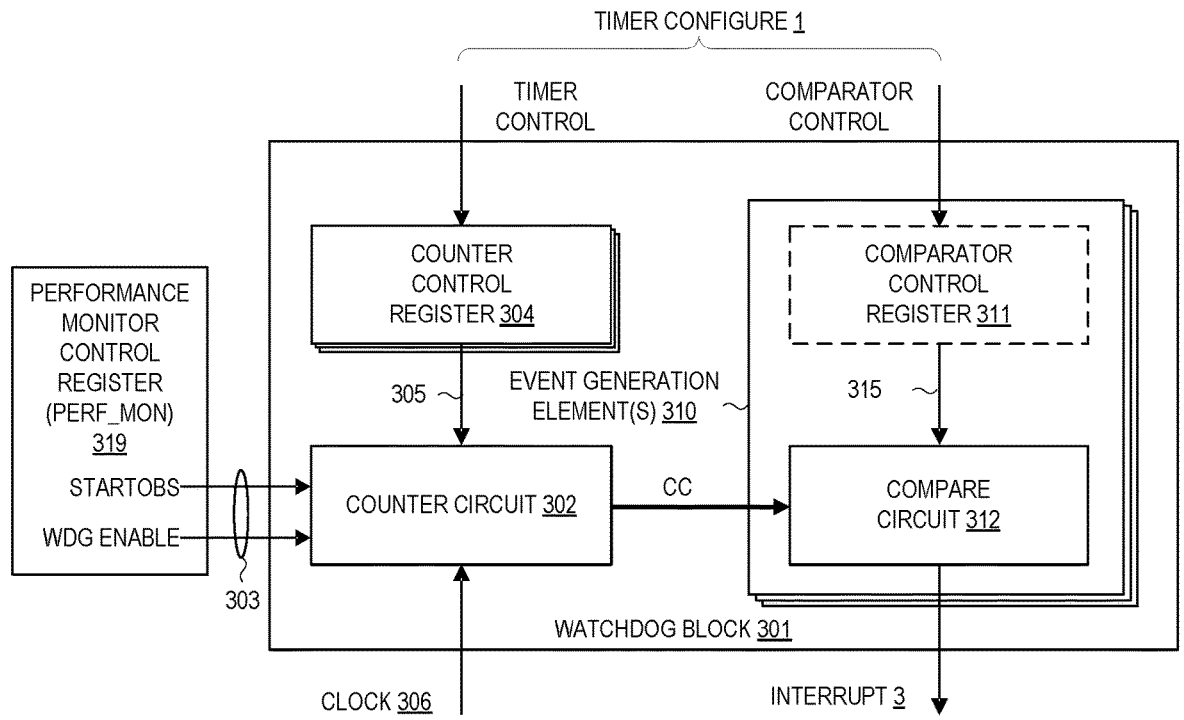
FIG. 3 is a simplified block diagram of a watchdog monitoring hardware circuit in accordance with selected embodiments of the present disclosure.

To provide additional details for an improved understanding of selected embodiments of the present disclosure, reference is now made to FIG. 3 which is a simplified block diagram depiction of a watchdog monitoring hardware circuit 300, such as may be employed in the timer block bank 115 and configured and controlled by timer configuration information 1 and control signal information 303 provided by the performance monitor control register 319. For the purpose of this description, the performance monitor control register aspect 319 in this figure reflects control signals provided by the performance control register 201 that are associated with a single watchdog instance, in this example the watchdog block 301. In the embodiment shown in FIG. 3, these are the signals STARTOBS and WDG ENABLE. While shown as a single watchdog block 301, it will be appreciated that the watchdog monitoring hardware circuit 300 may be implemented with multiple watchdog block instances, each controlled by a corresponding set of control signals 303 provided by a (different) aspect 319 of the performance monitor control register 201. Each watchdog block 301 may include a timer or counter circuit 302, one or more counter control registers 304, and one or more event generation elements 310 which each include a compare circuit 312 and an optional comparator control register 311 (as indicated with dashed lines). Depending on the setup of this block and configuration specified by the timer configuration information 1 and the control signal information 303 (e.g., STARTOBS, WDG ENABLE) generated in response to register accesses altering the corresponding control fields associated with this watchdog block 319 in the performance monitor control register 201, each watchdog block 301 may function as a watchdog element for use in monitoring runtime performance data during operation of software 120 for ensuring effective operation of software 120.

In a first example, the watchdog block 301 may be configured as a watchdog element by configuring the counter circuit 302 as an upward or downward counting timer circuit which is connected to receive an input clock 306, control signal information 303, and counter control signals 305 from the counter control register 304. In particular, the counter control signal(s) 305 from the counter control register 304 may configure the counter circuit 302 by specifying a start value ST (e.g., "0" when upwards counting or a countdown value when downwards counting), along with a timer_enable control, a timer clock source selection. In addition, comparator control signal(s) 315 may be applied to configure the compare circuit 312 by specifying an expiration value EX (e.g., "0" when downwards counting or an actual value that defines the expiration time when upwards counting) to indicate if the comparator circuit has detected a match between the counter output value CC and this value.

Once initialized by the counter control signals 305 and comparator control signals 315, the watchdog block 301 is ready for activation in response to the control signal information 303. For example, the control signal information 303 may include a STARTOBS control signal and a WDG ENABLE control signal to control the activation of the watchdog block 301 as indicated with the table 320. When the STARTOBS control signal is asserted (and regardless of the value of the ENABLE control signal), the watchdog block 301 starts operating by setting the value of the counter circuit 302 CC to the start value ST specified by the counter control register 304. With the STARTOBS control signal de-asserted and the ENABLE control signal asserted, the watchdog block 301 starts/continues counting (increment or decrement) operations at the counter circuit 302. With a de-asserted ENABLE control signal, the watchdog block 301 is disabled from performing the counting (increment or decrement) operation.

In operation of the activated watchdog block 301, the counter output CC of the counting timer circuit 302 is provided as an input to the comparison circuit 312 in an event generation element 310 which also stores an expiration value EX in the comparator control register 311 (or alternatively, as a hardcoded value; e.g., in case of a "zero" comparison value). The comparison circuit 312 then compares the counter output CC of the counting timer circuit 302 with the expiration value EX to generate an event or interrupt signal 3 when they match. If desired, a plurality of different watchdog elements may be formed by connecting a plurality of counting counter circuits 302 to a corresponding plurality of counter control registers 304 which store different timer reload or countdown values and by providing the output of the counting timer circuits 302 to a plurality of event generation elements 310. In such a plurality of event generation elements 310, the comparison circuit 312 may generate an event/interrupt signal 3 when it detects that the output of the counting timer circuit 302 CC matches the expiration value EX in the event time register 311.

As disclosed herein, software 120 may be configured to program the watchdog block 301 by writing timer configuration information 1 to the counter control register 304 and comparator control register 311. Though shown as being included in the watchdog block 301, it will be appreciated that the counter control register 304 and comparator control register 311 may also or instead be included in a single control register. Connected to receive a clock signal 306, the counter circuit 302, when started, increments or decrements a counter value CC in response to the clock signal pulse(s) 306, beginning from an initial value ST. With the output of the counter circuit 302 connected to one or more event generation elements 310 which compare the counter output CC to a timer comparison value EX stored in the comparator control register 311, the compare circuit 312 generates an event/interrupt signal 3 whenever the counter output CC matches the comparison value EX stored in the comparator control register 311. This event/interrupt signal 3 may be used as an interrupt signal that tells software 120 that watchdog block 301 has expired.

Figure 4:
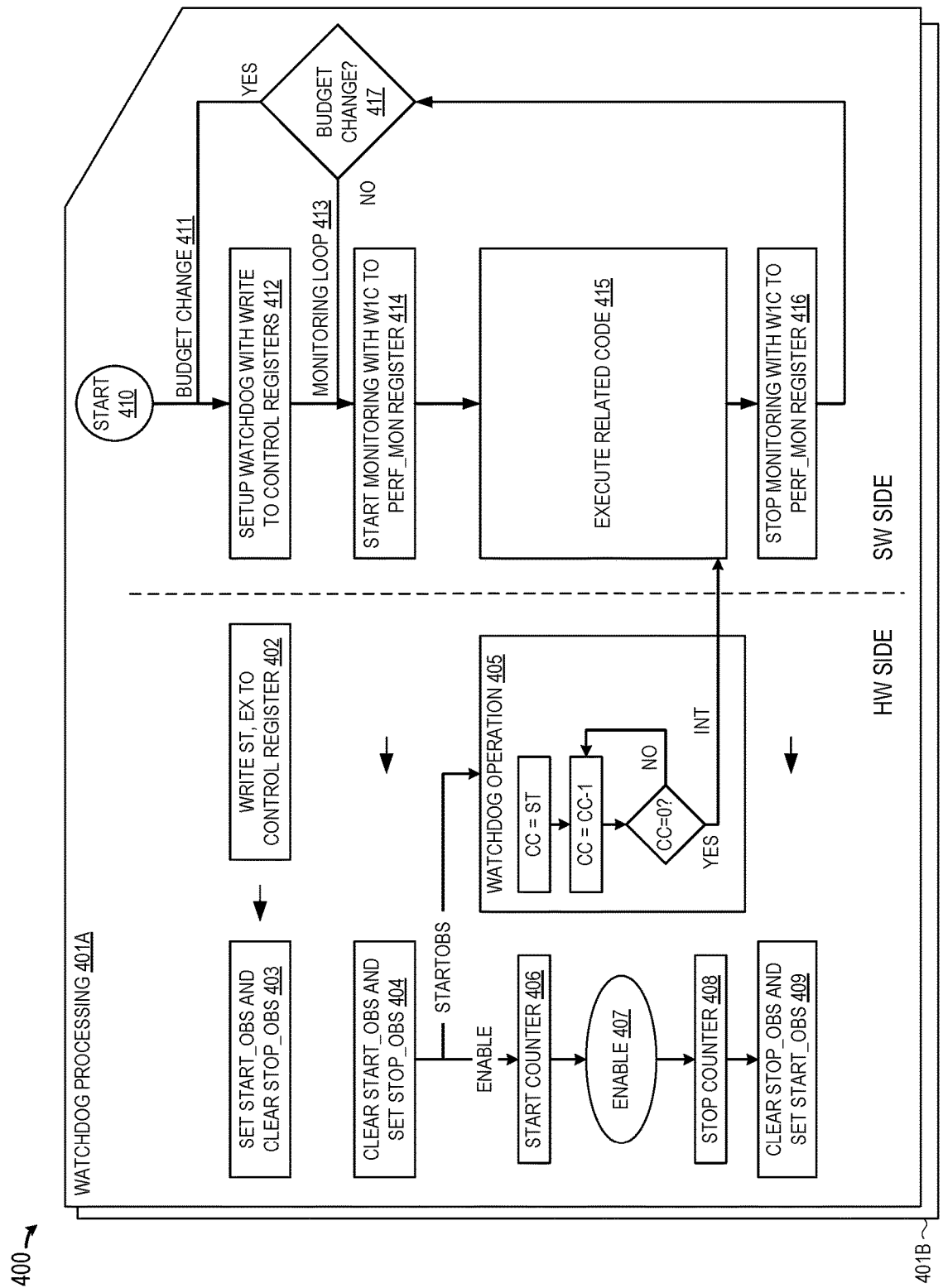
FIG. 4 is a simplified flow chart showing the logic for operating a watchdog monitoring circuit and associated hardware and software interactions during the watchdog processing to collect runtime performance data from executed code in accordance with selected embodiments of the present disclosure.

To provide additional details for an improved understanding of selected embodiments of the present disclosure, reference is now made to FIG. 4 which is a simplified flow chart 400 showing the logic for operating a watchdog block (e.g., the watchdog block 301) and associated hardware and software interactions during the watchdog processing to collect runtime performance data from executed code. In the depicted example embodiments, the control logic and methodology shown in FIG. 4 may be implemented in a system-on-chip (SoC) device, such as an automotive microcontroller, with a combination of hardware and software which collects runtime performance data by activating or deactivating a set of observation timers and watchdogs by a single control register. Thus implemented, the specified sequence of operations may be performed by control code executed on a processor core.

In FIG. 4, the method includes a sequence of steps 401A that are implemented in software (steps 410-417, at the right side of the figure) and hardware (steps 402-409, at the left side of the figure) to configure at least a first watchdog element for checking the software execution against a specific time budget while monitoring an observation window. As disclosed, the sequence of steps 401A can be replicated (401B) and run concurrently (especially the steps 414 and 416, which may represent the same register access to the PERF_MON register for controlling a multiplicity of observations 401A, 401B . . . ) on different watchdog blocks 301 to capture different runtime performance data sets for multiple, overlapping observations under control of a single performance monitor control register PERF_MON (e.g., a register 201 in an embodiment like the one shown in FIG. 2).

In the sequence 401A, the method starts at step 410 when the SOC device is booted up or turned "on" to begin normal operations. During boot-up, a performance monitor control register PERF_MON may store cleared watchdog start and stop bits (START_OBS, STOP_OBS=00) specifying that the watchdog element is not enabled. In this state, any write operations to the cleared watchdog start and stop bits will have no effect on any watchdog operation.

At step 412, the watchdog element is set up with one or multiple software write operations which write interface values into the watchdog control register and the comparator control register to enable the selected watchdog element, to define a time budget for the watchdog element, and to otherwise specify the watchdog behavior. For example, to configure the watchdog for performance monitoring, a STANDALONE control bit in the watchdog control register may be cleared at step 412 to specify that the watchdog element is not working independently but controlled by the performance monitor control register PERF_MON. In addition, setup write operations to the watchdog control register at step 412 may include writing or loading a multi-bit reload value ST (to specify the start value for the watchdog element) and/or a multi-bit expiration value EX (to specify the expiration value for the watchdog element).

In connection with the software step 412, there are hardware effects when the watchdog hardware is setup. In particular, the setup step 412 results in writing the reload value ST and expiration value EX=0 to the watchdog control register (step 402) using any suitable register write sequence. In addition, the setup step 412 results in setting the corresponding start bit (START_OBS=1) in the performance monitor control register PERF_MON (step 403) to enable the watchdog block for later activation without starting the timer. The corresponding stop bit (STOP_OBS, which is cleared) is not affected by this operation. With the setup values (START_OBS, STOP_OBS=10) for the start and stop bits in the watchdog control register, the watchdog element is enabled, but not active, after step 403.

After setup, the selected observation watchdog can be activated to start monitoring the related application code at software step 414. The monitoring start step 414 may be controlled by software to start monitoring operations by writing interface values into the corresponding start bit (e.g., START_OBS) of the performance monitor control register PERF_MON. To facilitate a corresponding functionality by a single write operation, the software step 414 may write the interface values into write-1-clear (WIC) fields of the performance monitor control register PERF_MON, such as by writing a "1" to clear a set start bit stored in a W1C field (e.g., START_OBS). Only when writing a "1" to an earlier set W1C field, this will clear the corresponding field and also set the corresponding stop bit (e.g., STOP_OBS) as is described further below. In contrast to using read-modify-write operations, the use of W1C fields allows a single write operation to alter the operation of the watchdog element at step 414 only when this is appropriate for the current state of the watchdog element.

In connection with the software step 414, there are hardware effects from starting the watchdog monitoring. In particular, the monitoring start step 414 results in setting the corresponding stop bit (STOP_OBS=1) in the performance monitor control register PERF_MON (step 404), when an earlier set START_OBS field has been cleared by writing a "1" to this field. When the field START_OBS has not been set before (e.g., without setting up the watchdog), then there is no change in the operation of the watchdog, as indicated by no change in the state of both fields START_OBS, STOP_OBS). Thus, the hardware step 404 may result in programming the W1C fields in the performance monitor control register PERF_MON with values (START_OBS, STOP_OBS=01) which activates the watchdog operation. In a disclosed embodiment, the corresponding change in the watchdog operation can be detected by a change of the field STOP_OBS from 0 to 1 and may be indicated by a STARTOBS control signal, which causes the loading of the start value ST into the counter circuit CC. The STARTOBS control signal can be generated upon clearing the START_OBS field (by writing a "1" into a set field), or alternatively when setting the STOP_OBS field as a result of clearing the START_OBS field. The value of the field STOP may also be utilized to drive the ENABLE control signal, which enables the counter circuit to continue counting as long as this field is set.

Coincident with the execution of related code at software step 415 (which immediately follows the start monitoring step 414), the selected observation watchdog starts running after starting the counter (step 406, e.g., by asserting the ENABLE control signal) to make a new observation measurement under control of the performance monitor control register PERF_MON. This operation is independent from the execution of the related code 415 performed by the watchdog hardware. During enabled watchdog operation 405, the clock counter value is decremented with each clock pulse (e.g., CC=CC−1) until counting is terminated (step 408, e.g., by de-asserting the ENABLE control signal) or the expiration value (CC=EX=0) is reached, at which point an error or interrupt signal (INT) is issued. The watchdog counter operation can be controlled, i.e., by an ENABLE control signal that is derived from the STOP_OBS field as is depicted in the hardware operation enable 407. When the expiration value EX is reached before the counting is terminated, the generated error or interrupt signal indicates that the execution of the related code 415 has exceeded its time budget. Otherwise (when the expiration value is not reached during the execution of the related code 415) the watchdog counter operation is stopped with the software step 416. The monitoring stop step 416 may be controlled by software by writing interface values into the corresponding stop field (e.g., STOP_OBS) of the performance monitor control register PERF_MON. Only when this field has been set before (e.g., by a start monitoring operation), writing a "1" into this bit field will clear it. Otherwise, writing a "1" into this field will have no effect on the operation of the watchdog. Therefore, a single write operation may be used to stop an activated watchdog monitoring, in contrast to using read-modify-write operations.

As disclosed herein, there may be further hardware effects associated with a deactivation of a watchdog element by clearing an earlier set STOP_OBS field. When the value of this field is utilized to drive the counter ENABLE control signal, the watchdog element will stop its continuous counting operation (step 408) upon clearing this bit field. Furthermore, clearing the stop bit (STOP_OBS=0) will alter the setting of the corresponding start bit (START_OBS=1) in the performance monitor control register PERF_MON (step 409). Coincidently, these are the startup values (START_OBS, STOP_OBS=10) which permit a new observation to be started. As a result of step 409, the W1C fields (START_OBS, STOP_OBS=10) stored in performance monitor control register PERF_MON are equivalent to the value of these fields before entering the observation sequence defined by the steps 414 to 416. This permits a simple and efficient monitoring loop 413 that is taken to repeat the sequence of steps 414-416 with the same control register interface values, thereby enabling the observation of the selected execution budget without having to modify the watchdog setup by writing to the control register of the watchdog block 301 every time the related code is executed 415. Since multiple observations 401A, 401B by different watchdog instances can be controlled concurrently with a single register access 414, 416, this permits an efficient control of a corresponding software execution.

When there is a change to the time budget or behavior (affirmative outcome to detection step 417), then the budget change loop 411 is taken to reconfigure the watchdog setup by a modified step 412 before repeating the sequence of steps 414-416. Only in this situation, a change of the watchdog setup is required by writing to a control register.

Figure 5:
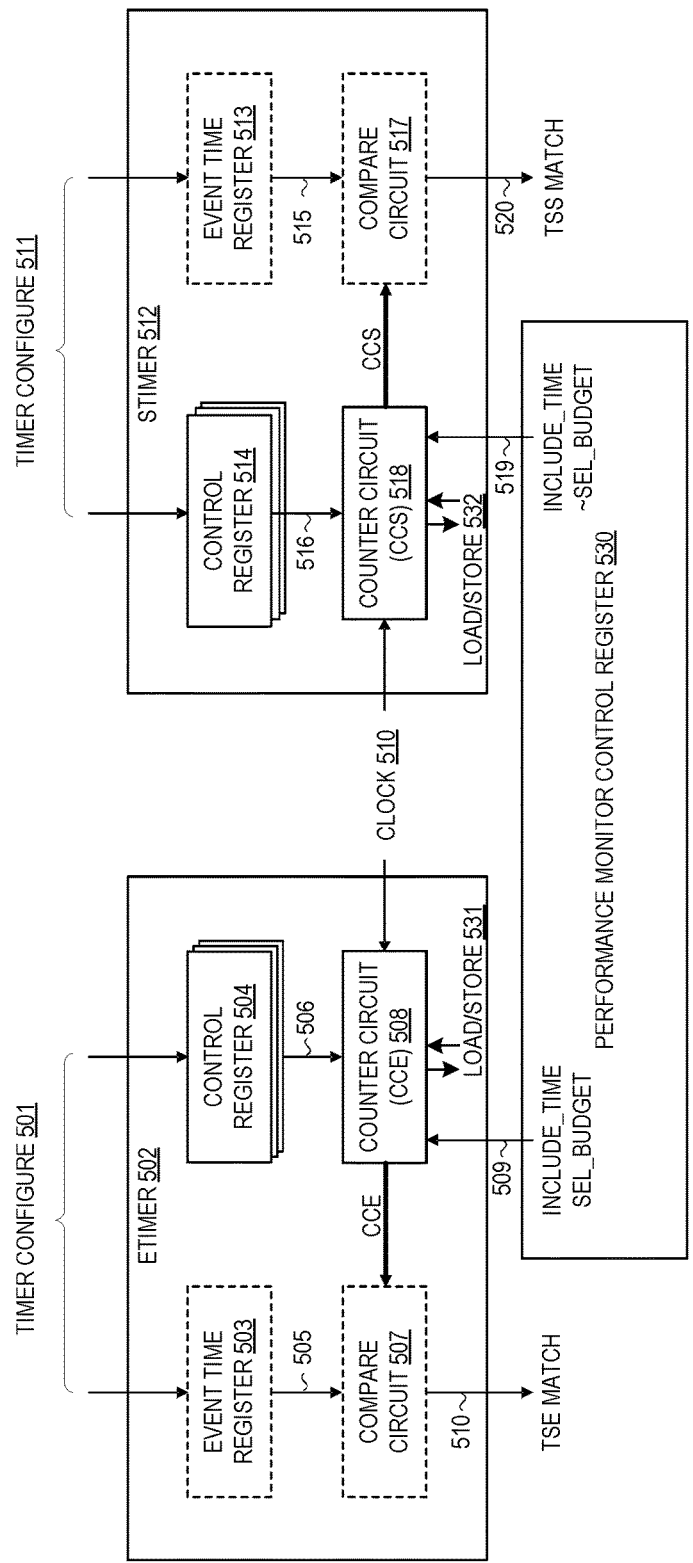
FIG. 5 is a simplified block diagram of a pair of timer monitoring hardware circuits in accordance with selected embodiments of the present disclosure.

To provide additional details for an improved understanding of selected embodiments of the present disclosure, reference is now made to FIG. 5 which is a simplified block diagram depiction of a timer monitoring hardware circuit 500, such as may be employed in the timer block bank 115 and configured and controlled by timer configuration information 1 (which is shown in FIG. 5 as being broken into a first timer configuration 501 for the ETIMER 502, and a second timer configuration 511 for the STIMER 512) and control signal information provided to both timer instances by the performance monitor control register PERF_MON 530. For the purpose of this description, the performance monitor control register aspect 530 in this figure reflects control signals provided by the performance control register 201 that are associated with a timer pair, in this example the ETIMER 502 and the STIMER 512, which are both instances of an observation timer 210. In the embodiment shown in FIG. 5, the corresponding control signals are generated from two control fields INCLUDE_TIME and SEL_BUDGET associated with this timer pair in the performance monitor control register PERF_MON. The content of both fields is operable to control the measurement by the timer pair (e.g., by driving the signal tmr_enable of the observation timer 210). Other embodiments may utilize alternative or further fields (e.g., the start_obs<i>, stop_obs<i> fields shown in FIG. 2) to control the measurement. In addition, further hardware signals may be utilized by the generation of the control signals to include some hardware status information in the measurement (e.g., one timer of the timer pair measures the execution in locked state, while the other timer of the timer pair measures the execution in unlocked state). While shown as a single timer pair, it will be appreciated that a multiplicity of timer monitoring hardware circuits 500 may be implemented in the timer block bank, each pair controlled by a corresponding set of control signals 509, 519 provided by a (different) aspect 530 of the performance monitor control register 201.

While shown as a pair of timer blocks ETIMER 502, STIMER 512 for measuring execution and stall times, it will be appreciated that each timer block 502, 512 in the timer monitoring hardware circuit 500 may be separately configured to collect task-related execution or stall information similar to the generalized observation timer 210 described in FIG. 2. Each timer block 502, 512 may include a timer or counter circuit CCE 508, CCS 518 and one or more counter control registers 504, 514, along with an optional compare circuit 507, 517, and an optional event time control register 503, 513 (as indicated with dashed lines). Depending on the setup and configuration specified by the timer configuration information 501, 511 and the control signal information 509, 519 generated in response to register field values (e.g., INCLUDE_TIME, SEL_BUDGET) in the performance monitor control register aspect PERF_MON 530, the paired timer blocks 502, 512 may function as timer elements for collecting task-related execution and stall information and for generating at least one interrupt when one of these timer elements exceeds its budget for use in monitoring runtime performance data. In a generalized form, such a timer pair is beneficial when a measurement of two alternating state conditions (e.g., selected by a control field SEL_BUDGET, or a hardware status signal) is desired.

Once initialized and enabled by the counter control signals 506, 516 and comparator control signals 505, 515, the timer blocks 502, 512 are ready for activation in response to the control signal information 509, 519 generated from register values in the performance monitor control register aspect PERF_MON 530. The combination of control signals 509, 519 generated in response to the register fields from the PERF_MON register 530 may include (by setting the field INCLUDE_TIME) or exclude (by clearing this field) the processing by software in the observation by this timer pair. The second field SEL_BUDGET has only an effect when the field INCLUDE_TIME is set to choose which of the two timers of the timer pair is selected to observe the current execution. For this purpose, the generation of the corresponding control signal (e.g., tmr_enable as shown in FIG. 2) provided to the ETIMER 502 can use an AND gate to combine the value of the INCLUDE_TIME field with the corresponding field SEL_BUDGET, while the control signal provided to the STIMER 512 can use an AND gate to combine the value of the INCLUDE_TIME field with the inverted field SEL_BUDGET (depicted as SEL_BUDGET). Other embodiments may include further fields (e.g., start_obs<i>, stop_obs<i> as shown in FIG. 2 e.g., to control a multiplicity of observation windows, or a multiplicity of timer pairs), or may include additional hardware status information in the control signal generation.

In a first example, each timer block 502, 512 may be programmed with timer configuration information 501, 511 to configure the timer/counter circuit 508, 518 as an upwards counting timer circuit. Thus configured, each timer/counter circuit 508, 518 is connected to receive a shared input clock 510, control signal information 509, 519 generated from the performance monitor control register aspect PERF_MON 530, and counter control signals 506, 516 generated from the counter control register 504, 514. In this arrangement, the counter control signal(s) 506, 516 may each configure the corresponding counter circuit 508, 518 by specifying a timer start value ST (e.g., zero), along with a timer_enable control, a timer clock source selection, a timer stop value (TSE, TSS), and one or more timer behaviors, such as whether the counter circuit 508, 518 operates as a one-shot or continuous counter. When operating as a one-shot counter, the counter stops after reaching its stop value. In addition or in the alternative, the counter control registers 504, 514 can define whether the counter circuit 508, 518 "wraps around" or continues to increment or decrement after the counter value reaches the timer stop value and is automatically reset to its initial starting value (e.g., zero). In addition or in the alternative, a control value written to counter control register 504, 514 can define whether the counter value increments or decrements with each pulse of a clock signal or with each x clock pulses, where x is an integer greater than one.

In addition or in the alternative, comparator control signal(s) 505, 515 may be applied to configure the corresponding compare circuit 507, 517 by specifying a corresponding comparison value (e.g., the timer stop value (TSE, TSS)), along with a comparison enable value and one or more comparison behaviors, such as a MATCH_ONCE register flag (to indicate whether the comparison circuit 507, 517 will disable itself after detecting a match between the counter output value CCE, CCS and the match value, e.g., the timer stop value TSE, TSS). In one embodiment, a MATCH_DONE register flag may be implemented to indicate if the comparator circuit has already detected a match between the counter output value CCE, CCS and the match value (e.g., the timer stop value TSE, TSS). With the timer output CCE, CCS of each upwards counting timer circuit 508, 518 provided, respectively, to the comparison circuit 507, 517, the timer outputs CCE, CCS can be compared with a match value, such as the timer stop value TSE, TSS stored in the event time register 503, 513. In case of a match of both values, the comparison circuit 507, 517 generates event signals 510, 520, which may be provided as match event (TSE MATCH or TSS MATCH). These external match events TSE MATCH or TSS MATCH may be used as an interrupt signal to the software 120 to indicate that a timer block has reached its expiration value.

In selected embodiments, this event can be utilized to set the MATCH_DONE register flag and the forwarding of this event as an external event (TSE MATCH or TSS MATCH) can be suppressed when the MATCH_DONE register flag is set. Corresponding functionality can be enabled or disabled (e.g., a comparison behavior in form of the MATCH_ONCE register). When this functionality is enable, then the comparison circuits 507, 517 provide only an external match event (TSE MATCH or TSS MATCH) for the first match of the timer output CCE or CSS, and any subsequent match will be suppressed and does not generate an external match event. A corresponding functionality is beneficial for a specific handling of repeated requests under software control, where clearing the MATCH_ONCE control bit can disable the usage of the MATCH_DONE flag, generating a corresponding external match event (TSE MATCH or TSS MATCH) every time the timer 502, 512 assumes a value equivalent to the match value 505, 515. In such a situation, software would be expected to properly manage a subsequent match or disabling the comparison before this match may occur again. When this is not beneficial, setting the MATCH_ONCE control bit can enable the usage of the MATCH_DONE flag, which will suppress any subsequent external match event after the first one without software intervention.

As disclosed herein, the control values in the performance monitor control register aspect PERF_MON 530 are operable to control an observation timer pair ETIMER 502, STIMER 512 to perform a first measurement of the software execution. The application of control signal information 509, 519 enables a behavior where none of the timers 502, 512 is running (e.g., when field INCLUDE_TIME is 0) or where only one of the timers 502, 512 is running (e.g., INCLUDE_TIME is 1), in the latter case the timer instance is selected by the SEL_BUDGET. A corresponding measurement capability is beneficial when a measurement of both alternating states of a software execution is desired. A related capability can be implemented in an equivalent manner for a multiplicity of states by a corresponding number of observation timers. In cases where corresponding measurements are beneficial for multiple concurrent measurements (e.g., multiple tasks that may preempt each other), or a series of measurements, the timer pair scheme in FIG. 5 can be further extended.

In one embodiment, it may be beneficial to offload or store the current counter value CCE or CCS, and load an earlier stored counter value associated with another software operation. Such a capability is shown in FIG. 5 by a separate load/store connection 531, 532 that can be used to emulate a plurality of timers by less hardware timers. By loading a counter value that has been stored after an earlier measurement, a sequence of related measurements can be supported; each measurement targeting another virtual timer instance. In this way, multiple timers can be emulated by loading/storing corresponding information in a smaller number of timer pairs. To this end, a timer pair 502, 512 may be selected for use in emulating multiple timers, such as by writing to a designated field (not shown) in the performance monitor control register aspect 530 for selecting the timer pair 502, 512. For the selected timer pair, the current counter timer value CCE, CCS for a given timer measurement may be loaded in the background or stored when swapping using the separate load/store connections 531, 532. Alternatively, a background DMA process may be applied that identifies a corresponding timer pair (implicitly or by using a particular selection, e.g., by a TIMER_SELECT field or a START_OBS/STOP_OBS field set) and loads/stores the current counter timer value CCE, CCS using the separate load/store connections 531, 532.

In another embodiment, it may be beneficial to perform multiple measurements concurrently, which requires the usage of multiple timer instances, as shown in FIG. 2. For this purpose, the observation window selection already described for the watchdog operation via a pair of W1C fields START_OBS, STOP_OBS can be utilized to extend the observation timer scheme. Equivalently to the observation window selection described for FIG. 4, a pair of fields START_OBS and STOP_OBS can be used to identify the start and stop of the monitoring by a particular timer or timer pair; in this case the generated STARTOBS control signal can be used to reset the timer to a start value ST, or request a the loading of an earlier measurement (as this has been described in the earlier paragraph). The ENABLE control signal provided by this embodiment is then operable to enable the counter increment similarly to the operation of the watchdog, and equivalent to the combination of the fields INCLUDE_TIME and (~)SEL_BUDGET. The de-assertion of the ENABLE signal can then also be used to request the storage of the current counter value; as this has been described in the earlier paragraph. Multiple of such field pairs may be used to control multiple timer instances or multiple timer pairs. As has been described above, the corresponding functionality may also be combined with a functionality to load/store counter values.

In another embodiment, an equivalent implementation consisting of multiple timer instances can be controlled by a matching amount of INCLUDE_TIME<i>, SEL_BUDGET<i> fields within the performance monitor control register PERF_MON 530. In this case, any timer pair is controlled by an individual set of control signals 509, 519 that is provided by its field pair INCLUDE_TIME<i>, SEL_BUDGET<i>. Also this implementation can be combined with a functionality to load/store counter values, as described earlier.

Any of these implementations of a control scheme for one or multiple observation timer (pair) instances may be implemented within the performance monitor control register and utilized to control the complete set of associated timer instances concurrently by a single register write operation. As illustrated in FIG. 2, any of these control mechanisms is controlling a particular timer instance by a tmr_enable control signal that enables the measurement, and a may also utilize a reset control signal to initialize the timer value when this is beneficial.

Figure 6:
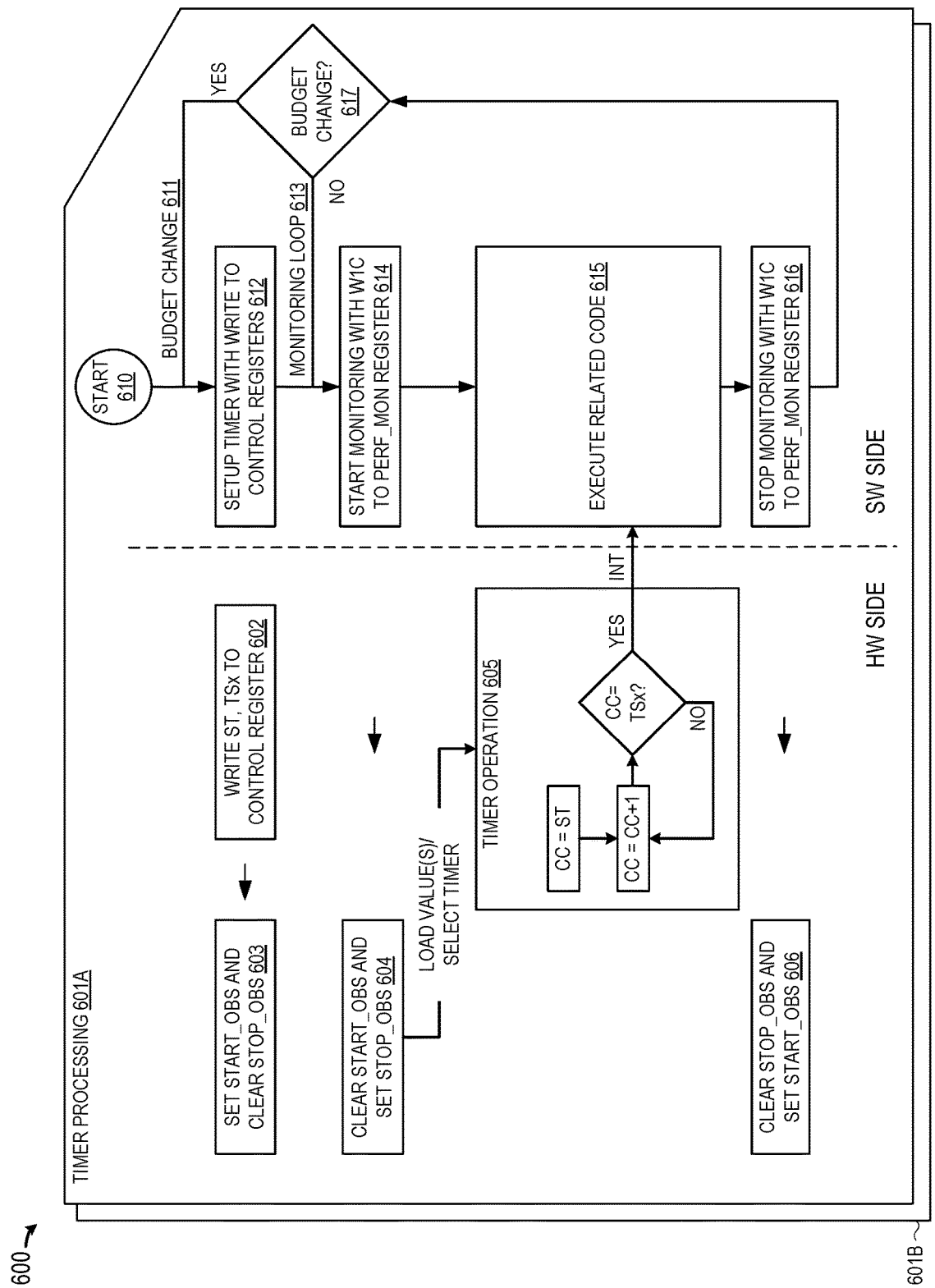
FIG. 6 is a simplified flow chart showing the logic for operating a measurement timer and associated hardware and software interactions during the timer processing to collect runtime performance data from executed code in accordance with selected embodiments of the present disclosure.

To provide additional details for an improved understanding of selected embodiments of the present disclosure, reference is now made to FIG. 6 which is a simplified flow chart 600 showing the logic for operating a measurement timer (which can be a single observation timer or a timer of a timer pair) and associated hardware and software interactions during the timer processing to collect runtime performance data from executed code. In the depicted example embodiments, the control logic and methodology shown in FIG. 6 may be implemented in a system-on-chip (SoC) device, such as an automotive microcontroller, with a combination of hardware and software which collects runtime OS performance data by activating a set of observation timers and watchdogs with interface values written to a single control register. Thus implemented, the specified sequence of operations may be performed by control code executed on a processor.

In FIG. 6, the method includes a sequence of steps 601A that are implemented in software (steps 610-617, at the right side of the figure) and hardware (steps 602-606, at the left side of the figure) to configure at least a first timer element for collecting task-related execution or stall information and generating an interrupt if the timer element exceeds its budget, where the sequence of steps 601A can be replicated (601B) and run concurrently (especially the steps 614 and 616, which may represent the same register access to the PERF_MON register for controlling a multiplicity of observations 601A, 601B that may further execute concurrently with the earlier described observations 401A, 401B, when the steps 414 represent the same operation as the step 614 and the step 416 represent the same operation as the step 614) to capture different runtime performance data sets for multiple, overlapping observations under control of a single control register PERF_MON. This description references an embodiment that utilizes a control by a START_OBS, STOP_OBS pair of fields as described earlier for FIG. 4; however, it will be understood that any other suitable control capability (e.g., an INCLUDE_TIME, SEL_BUDGET field pair) can be used equivalently or in addition, as described earlier.

In the sequence 601A, the method starts at step 610 when the SOC device is booted up or turned "on" to begin normal operations. During boot-up, a performance monitor control register may store cleared timer start and stop bits (START_OBS, STOP_OBS=00) specifying that the timer element is not enabled, in which case any write operations to the cleared timer start and stop bits will have no effect on any timer operation.

At step 612, the timer element is set up with a software write operation which writes interface values into the timer control register to enable the selected timer element, to define a time budget for the timer element, and to otherwise specify the timer behavior. For example, the setup write operations to the timer control register at step 612 may include writing or loading a start or reload value ST (to specify the initial value for the timer counter circuit) and/or a timer stop value TSx (e.g., to specify an expiration value for the timer element). In addition, to configure the timer for performance monitoring, a ONE_SHOT control bit in the timer control register may be specified at step 612 to specify whether the timer element stops counting (e.g., ONE_SHOT=1) or wraps around to begin counting from the start value (e.g., ONE_SHOT=0) upon reaching a timer stop value.

In connection with the software step 612, there may be hardware effects when the timer hardware is setup. In particular, the setup step 612 results in writing the start value ST and timer stop value TSx to the timer control register (step 602) using any suitable register write sequence. In addition, the setup step 612 results in setting the corresponding start bit (START_OBS=1) and resetting the corresponding stop bit (STOP_OBS=0) in the performance monitor control register (step 603) to enable (but not start) the timer. With the setup values (START_OBS, STOP_OBS=10) for the start and stop bits in the timer control register, the timer element is enabled, but not active, at step 603.

After setup, the selected observation timer is activated to start monitoring the code at software step 614. The monitoring start step 614 may be controlled by software by writing interface values into the relevant start bit (e.g., START_OBS) of the performance monitor control register. To facilitate the write operations, the software step 614 may write the interface values into write-1-clear (W1C) fields of the performance monitor control register to allow a single write operation to set up the timer element at step 614, in contrast to using read-modify-write operations. Equivalent to the operation of a watchdog element, such a W1C operation only starts a monitoring operation, when the relevant start bit START_OBS has been set before and is thus cleared by writing a "1". A simpler control scheme may be implemented by an INCLUDE_TIME, SEL_BUDGET field pair as is described earlier, which just enables/disables the corresponding timer operation. However, such a simple control scheme alone will always modify the timer behavior when writing to the performance monitor control register PERF_MON—only a combination with other control schemes (e.g., the START_OBS, STOP_OBS field pair) enables a write operation that does not modify the timer behavior when this is not intended. As such, it is possible to extend or refine a control scheme by combining it with another one, such as a simple scheme like INCLUDE_TIME, SEL_BUDGET with a multiplicity of observation windows as defined by a START_OBS,STOP_OBS pair. For this purpose it is only required to logically combine (e.g., AND or OR) the corresponding control signals to achieve the desired control functionality.

In connection with the software step 614, there are hardware effects from starting the timer monitoring. In particular, the monitoring start step 614 results in clearing the start bit (START_OBS=0) and setting the corresponding stop bit (STOP_OBS=1) in the performance monitor control register (step 604), thereby starting the timer as this has already been described for FIG. 4. As described earlier, this control scheme may utilize the value of the field STOP_OBS to provide the ENABLE signal for the timer operation. An alternative embodiment may generate a corresponding ENABLE signal from the field pair INCLUDE_TIME, SEL_BUDGET. It is also possible to replicate or combine both methods to support a multiplicity of timer pairs that is running concurrently. In addition, the selected start method may implement a capability to provide a start value ST (either by resetting the timer, using its earlier value, or loading the value, such as by using a background DMA).

Coincident with the execution of related code at software step 615, the selected observation timer starts operating to make a new time measurement under control of the performance monitor control register. To this end, the control signals generated in response to the performance monitor control register PERF_MON field values are issued to enable the timer operation (step 605), such as by generating an ENABLE signal (e.g., tmr enable) to enable the timer measurement operation 605. In particular, the timer_enable control signal enables incrementing the counter with each clock pulse (e.g., CC=CC+1) until the timer stop value TS is reached (CC=TS), at which point an error or interrupt signal (INT) is issued.

Unless an interrupt signal is issued, the timer measurement process 605 may continue until counter operation is stopped with the software step 616. The monitoring stop step 616 may be controlled by software by writing interface values into the relevant stop bit (e.g., STOP_OBS) of the performance monitor control register. Since the write operations at software step 616 may write the interface values into W1C fields of the performance monitor control register, a single write operation may be used to stop the timer measurement process, in contrast to using read-modify-write operations. Equivalently to a watchdog operation, only an active timer operation (START_OBS=0,STOP_OBS=1) can be stopped by writing a "1" to the STOP_OBS field. Any other combination has no effect. Similar behavior can be achieved by writing the field pair INCLUDE_TIME, SEL_BUDGET that is directly controlling this timer. When the timer is deactivated, the current timer value may be stored in a memory location by a background DMA process.

After step 616, the runtime performance data collected through the sequence of steps 614-616 may be output under software control or by a background DMA as described earlier. In addition or in the alternative, the observation timer may be reset before repeating the sequence of steps 614-616, thereby enabling a continuation or a new start of a corresponding measurement. If there is no change to the time budget or behavior (negative outcome to detection step 617), then the monitoring loop 613 is taken to repeat the sequence of steps 614-616 with the same control register interface values. However, if there is a change to the time budget or behavior (affirmative outcome to detection step 617), then the budget change loop 611 is taken to reconfigure the timer setup before repeating the sequence of steps 614-616.

There are many beneficial applications for using the disclosed monitoring hardware circuit hardware to support OS-centric performance monitoring with data collection. To provide an illustrative, non-limiting example, the AUTOSAR standard has identified timing protection features that are intended to also support the ISO 26262 functional safety standard as a measure to address possible hazards caused by malfunctioning electronic and electrical systems in automotive or passenger vehicles. In this standard, a timing fault in a real-time system occurs when a task or interrupt misses its deadline at runtime. The AUTOSAR standard does not provide a deadline monitoring mechanism for timing protection purposes. Identifying the task/ISR causing a timing fault because a deadline violation could have many root causes, and could even be due to a timing fault introduced by an unrelated task/ISR that interferes/blocks for too long. For example, a timing fault could actually originate with a previous, unrelated task/ISR that propagates through the system until a subsequent task/ISR misses its deadline. The task/ISR that misses the deadline is not necessarily the task/ISR that has misbehaved at runtime—it is simply the earliest point that a timing fault is detected. If action is taken when such a misbehavior can be detected (e.g., by deadline monitoring that is appropriate for this purpose), then this will allow an earlier and often improved response that may allow to avoid or inhibit a subsequent timing fault. Without a capability to identify a misbehaving task based on a missed deadline identified with deadline monitoring, this would potentially use false evidence of an error to terminate a correct OS task in favor of allowing an incorrect OS task to continue running.

Figure 7:
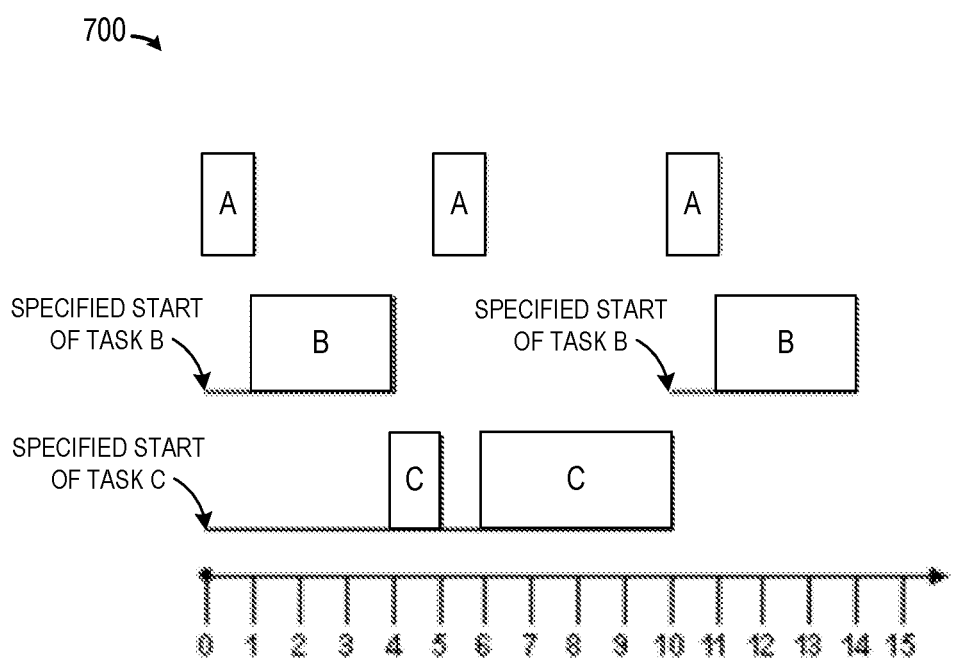
FIG. 7 illustrates a first example execution trace for a plurality of tasks which are meeting their respective deadlines.

To illustrate related challenges from the present disclosure, reference is now made to FIG. 7 which depicts a first example execution trace 700 for a plurality of tasks A, B, C. The information from in this figure is taken as is from the AUTOSAR standard document entitled "Specification of Operating System" V3.1.1 and only intended to illustrate the challenges related to a correct observation of root causes for a timing failure. As is known by the state of the art this is only an example for the potential set of related issues, and should not be understood as a limiting subset that is describing the complete set of related issues. As shown in the execution trace 700, the example system has the following configuration of tasks:

| Task ID | Priority | Execution Time | Deadline (=Period) |
|---------|----------|----------------|--------------------|
| A | High | 1 | 5 |
| B | Medium | 3 | 10 |
| C | Low | 5 | 15 |

Assuming that all tasks are ready to run at time zero, each depicted task in the first example execution trace 700 is executed in priority sequence and all tasks would meet their respective execution deadlines. In particular, task A is given execution priority over the lower priority tasks B, C. Similarly, task B, which has execution priority over the lower priority task C, is able to complete execution without exceeding its execution deadline. Finally, the lowest priority task C, even though interrupted by higher priority tasks A, C, is able to complete execution without exceeding its execution deadline.

Figure 8:
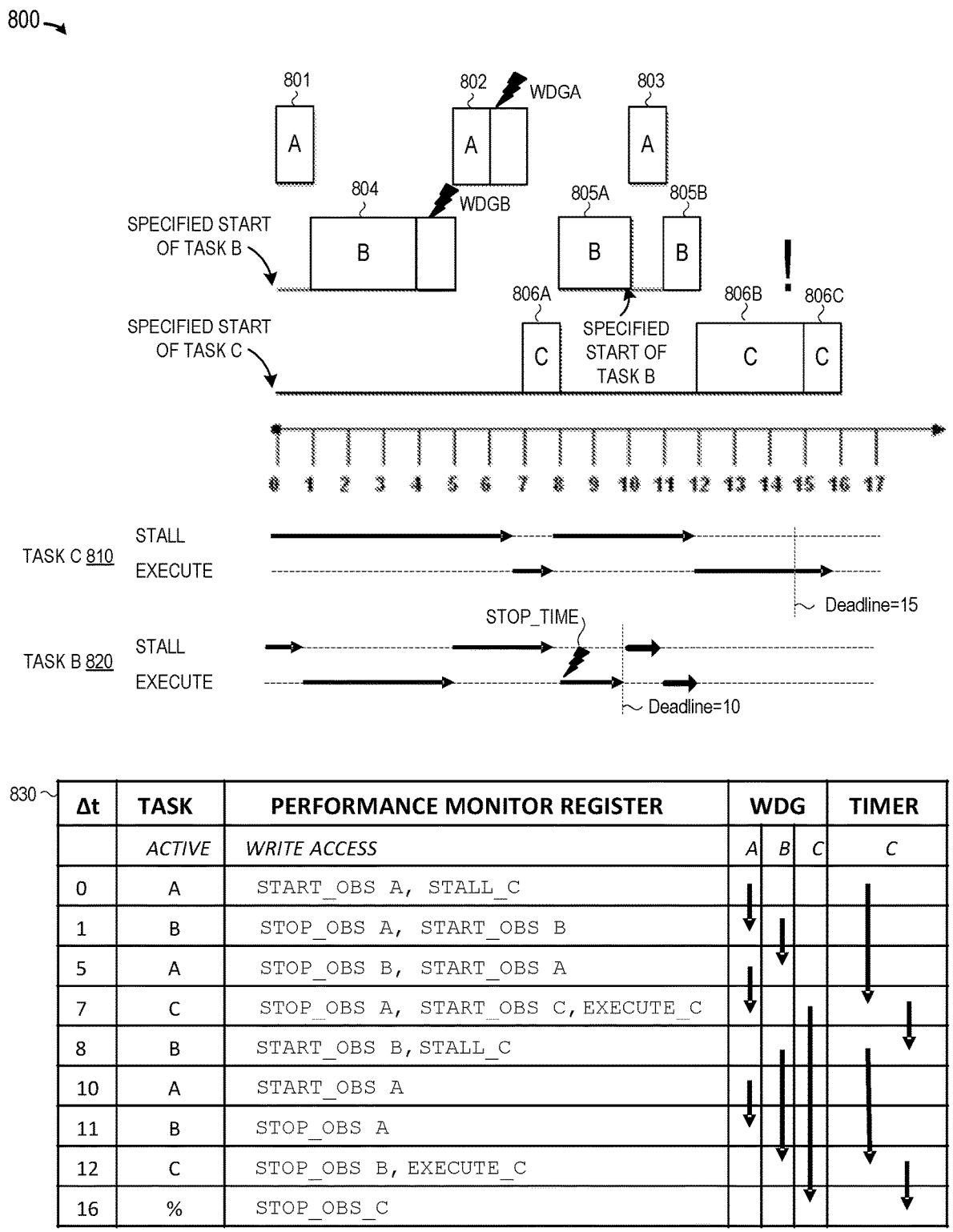
FIG. 8 illustrates a second example execution trace for a plurality of tasks which are not meeting their respective deadlines to illustrate how related task runtime data is collected with a monitoring hardware circuit in accordance with selected embodiments of the present disclosure.

To illustrate how related runtime performance data may be collected with a monitoring hardware circuit in which a performance monitor control register PERF_MON is programmed to control timer and watchdog elements in accordance with selected embodiments of the present disclosure, reference is now made to FIG. 8 which illustrates a second example execution trace 800 for a plurality of tasks which are not meeting their respective deadlines. In this trace 800, both task A 802 and task B 804 execute for longer than specified. In addition, task B 805 arrives two ticks earlier than specified. While the "misbehaving" tasks A 802 and B 804, 805 meet their execution deadlines, task C 806 behaves correctly, but fails to meet its deadline because of the incorrect execution of tasks A 802 and B 804, 805. This illustrates the problem of fault propagation where a fault in an unrelated part of the system is causing a correctly functionality part of the system to fail.

As will be appreciated from this example, the ability of a task or ISR to meet its deadline in a fixed priority preemptive operating system like AUTOSAR OS is determined by the following factors: (1) the execution time of any Task/ISRs in the system, (2) the blocking time that any Task/ISRs suffers from lower priority Tasks/ISRs locking shared resources or disabling interrupts, and (3) the inter-arrival rate of any Task/ISRs in the system. Based on these identified factors, the AUTOSAR standard uses a budget mechanism to locate the violating entity. To this end, the following budgets can be configured:

OS Interrupts (ISR2; category 2 interrupts) Lock Time: Amount of time a TASK/ISR2 can disable OS Interrupts (by SuspendOSInterrupts).

All Interrupts (category 1 and 2) Lock Time: Amount of time a TASK/ISR2 can disable all Interrupts (by SuspendAllInterrupts, DisableAllInterrupts).

Resource Lock Time: Amount of time a TASK/ISR2 can lock a specific resource (by GetResource).

Execution Budget for TASK and ISR2 (category 2 interrupt): Amount of time a TASK/ISR2 can be executing (RUNNING status for a TASK). The budget is paused when a TASK/ISR2 is preempted. The budget is refilled when a TASK/ISR2 terminate or a TASK block on a WaitEvent.

With reference to these example budget mechanisms, selected embodiments of the disclosed monitoring hardware circuit can be efficiently used to monitor a plurality of different budgets allocated to specific functionalities or features since the disclosed performance monitor control register PERF_MON can be programmed to control a dedicated set of timer and watchdog elements concurrently. Referring back to FIG. 8, this control functionality is illustrated with reference to the operation of a dedicated set of observation timers and watchdogs which are controlled with specified write accesses to register interface values in the performance monitor control register PERF_MON which control the timers used to measure task-related execution and stall information and which also control the watchdogs used to observe a particular timing budget. In particular, the first watchdog WDGA is configured to measure the execution time required to perform task A by performing write accesses to related first and second register interface fields (e.g., START_OBS A, STOP_OBS A) for the first watchdog WDGA when execution of Task A starts and stops. In similar fashion, the second watchdog WDGB is configured to measure the execution time required to perform task B by performing write accesses to related first and second register interface fields (e.g., START_OBS B, STOP_OBS B) for the second watchdog WDGB when execution of Task B starts and stops. Finally, the third watchdog WDGC is configured to measure the execution time required to perform task C by performing write accesses to related first and second register interface fields (e.g., START_OBS C, STOP_OBS C) for the third watchdog WDGC when execution of Task C starts and stops. In addition to using observation watchdogs to monitor the tasks, each of the tasks may have an allocated timer pair that is configured to measure the observed task execution and stall times for each of tasks A-C. For example, a first timer pair TIMER C may be configured to collect the task-related execution and stall information for Task C by performing write accesses to first and second register interface fields for the first timer pair TIMER C (e.g., EXECUTE_C, STALL_C) when Task C starts and stops executing.

As shown with the execution trace 800, Task A has execution times t=0-1, t=5-7, and t=10-11, but there are no stall times for Task A since it is the highest priority task. In table 830, the configuration of the first watchdog WDGA to monitor Task A's active states is controlled by performing write accesses to the register interface fields START_OBS A, STOP_OBS A in the performance monitor control register PERF_MON. In this table, only relevant register write operations (operations that are causing a change in operation) are shown for the sake of clarify; which are in case of the preferred embodiment depicted earlier a write of a "1" to a set register field. For example, when the register interface fields in the performance monitor register are structured as W1C fields, the first watchdog WDGA may be efficiently activated by writing a "1" to a set bit in the register interface field START_OBS A when execution of Task A starts, thereby clearing the register interface field START_OBS A and simultaneously setting the register interface field STOP_OBS A. In similar fashion, the first watchdog WDGA may be efficiently deactivated or stopped by writing a "1" to a set bit in the register interface field STOP_OBS A when execution of Task A stops, thereby clearing the register interface field STOP_OBS A and simultaneously setting the register interface field START_OBS A. The start and end rows of the resulting time measurements with the first watchdog WDGA from the execution trace 800 are shown with arrows in the WDG(A) column of the table 830. As shown in execution trace 800, the first watchdog WDGA is configured to detect that the execution budget for Task A 802 has been exceeded (e.g., when Task A 802 executes too long from t=5-7, as depicted by a lightning symbol).

As shown with the execution/stall timeline for Task B 820, Task B has execution times t=1-5, t=8-10, and t=11-12, and has stall times t=0-1, t=5-8, and t=10-11. In particular, with Task B 804 being a specified to be ready for execution at t=0, it is stalled from t=0-1 while higher priority task A 801 proceeds, after which Task B 804 executes from t=1-5. From t=5-7, Task B is stalled while higher priority task A 802 proceeds and until Task B 805A prematurely starts execution again from t=8-10. With a timer pair configured to measure the execution time for Task B, the premature arrival of Task B 805A may be detected, as indicated with the STOP_TIME lightning symbol. Task B 805 is stalled from t=10-11 while higher priority task A 803 proceeds, and then continues execution of Task B 805B until completion at t=11-12.

In table 830, the configuration of the second watchdog WDGB to monitor Task B's active states is controlled by performing write accesses to the register interface fields START_OBS B, STOP_OBS B in the performance monitor control register PERF_MON. In this table, only relevant register write operations (operations that are causing a change in operation) are shown for the sake of clarity with reference to a W1C field embodiment where a write of a "1" to a set register field effects a change. It also shows that a multiplicity of watchdog/timer operations has to be modified by a single access to the performance monitor register to beneficially control multiple, concurrent observations.

Although the third column (PERFORMANCE MONITOR REGISTER) of table 830 only shows relevant register operations, it must be understood that any write access to this register will always write into all fields implemented within this register (which makes it essential to implement a "no operation" functionality that does not alter the behavior of the corresponding hardware element when writing to the set of fields controlling a timer or watchdog element). When the register interface fields are structured as W1C fields, the second watchdog WDGB may be efficiently activated by writing a "1" to a set bit in the register interface field START_OBS B when execution of Task B starts, thereby clearing the register interface field START_OBS B and simultaneously setting the register interface field STOP_OBS B. In similar fashion, the second watchdog WDGB may be efficiently deactivated or stopped by writing a "1" to a set bit in the register interface field STOP_OBS B when execution of Task B stops, thereby clearing the register interface field STOP_OBS B and simultaneously setting the register interface field START_OBS B. The start and end rows of the resulting time measurements with the second watchdog WDGB from the execution trace 800 are shown with arrows in the WDG(B) column of the table 830. As shown in execution trace 800 the second watchdog WDGB is configured to detect that the execution budget for Task B 804 has been exceeded (e.g., when Task A 804 executes too long from t=1-5, as depicted by a lightning symbol).

As shown with the execution/stall timeline for Task C 810, Task C has execution times t=7-8 and t=12-16, and has stall times t=0-7 and t=8-12. In particular, with Task C 806A being ready for execution at t=0, it is stalled from t=0-7 while higher priority tasks A 801, 802 and B 804 proceed. Once the higher priority tasks are completed, Task C 806A executes from t=7-8, but is then stalled from t=8-12 while higher priority tasks A 803 and B 805A, 805B proceed. Finally, execution of Task 806 is completed from t=12-16.

In table 830, the configuration of the third watchdog WDGC to monitor Task C's active states is controlled by performing write accesses to the register interface fields START_OBS C, STOP_OBS C in the performance monitor control register PERF_MON. In this table, only relevant register write operations (operations that are causing a change in operation) are shown for the sake of clarify; which are in case of the preferred embodiment depicted earlier a write of a "1" to a set register field. When the register interface fields are structured as W1C fields, the third watchdog WDGC may be efficiently activated by writing a "1" to a set bit in the register interface field START_OBS C when execution of Task C starts, thereby clearing the register interface field START_OBS C and simultaneously setting the register interface field STOP_OBS C. In similar fashion, the third watchdog WDGC may be efficiently deactivated or stopped by writing a "1" to a set bit in the register interface field STOP_OBS C when execution of Task C stops, thereby clearing the register interface field STOP_OBS C and simultaneously setting the register interface field START_OBS C. The resulting time measurements with the third watchdog WDGC from the execution trace 800 are shown with arrows in the WDG(C) column of the table 830.

In addition to watchdog monitoring, the first timer pair TIMER C may be configured to measure the execution and stall times for Task C by performing write accesses to register interface fields for controlling the first timer pair TIMER C (e.g., EXECUTE_C, STALL_C) by the performance monitoring control register PERF_MON when Task C starts and stops executing. As described earlier, there are multiple implementation options for a corresponding control functionality, which is abstracted by using the operation "STALL_C" to reflect enabling of the STALL timer for task C and the operation "EXECUTE_C" to reflect enabling the EXECUTE timer for task C. As disclosed herein, these operations may be implemented with suitable control options (e.g., by a START_OBS,STOP_OBS register field pair or an INCLUDE_TIME,SEL_BUDGET register field pair, etc. . . . ). The start and end rows of the resulting time measurements with the first timer pair TIMER C from the execution trace 800 are shown with arrows in the TIMER(C) column of the table 830 which shows that Task C stalls at t=0, begins executing at t=7, stalls at t=8, restarts execution at t=12, and completes execution at t=16. There are multiple options of utilizing the first timer pair TIMER C in combination with the performance monitoring control register PERF_MON to identify an issue in the execution of this task. For example, a maximum budget may be specified for stalling this task which can be easily determined by subtracting the execution time 5 from the deadline 15. Observing this budget by the STALL timer of the first timer pair TIMER C would permit to identify a related error condition at the earliest time when it is exceeded (which is a time 11 in the time line). This in advance of approaching the deadline for this task (at time 15), which may enable a beneficial earlier error handling for this condition. However, this may not be required when the other tasks are also observed (as described earlier), since the root cause(s) for this issue would have already been detected.

The WRITE ACCESS column of table 830 identifies some important needs for implementing an efficient control mechanism via a register interface, like the one that is provided by the disclosed embodiment of the performance monitor control register PERF_MON which may be used to control all observation features (timers, watchdogs) with a minimum amount of register access operation. As disclosed herein, the minimum amount of access operations is a single access which is implemented as a write operation (as opposed to a read-modify-write operation). Whenever a task switch operation occurs, it must be possible to modify the fields controlling the operation of all involved observation features, but only those. Observation features that should not change their operation should not be affected by this register access. Since any task switch operation at least deactivates one task, and activates a second one (in any combination, where further features may have to be controlled concurrently) an appropriate corresponding functionality in the concurrent control of the related observation feature is required. Leaving the observation features of not affected tasks not affected is equally important; also here any combination of features may be selected concurrently.

This is illustrated in the WRITE ACCESS column by enumerating only relevant operations (bits of the exemplary write operation specified for the preferred embodiment that are altering the behavior of an observation feature). In particular, the WRITE ACCESS column identifies where a corresponding write access alters one or more behaviors. For example, the write access at time 7 stops the observation by WDGA (STOP_OBS A), starts the observation by WDGC (START_OBS C), and enables the observation by the EXECUTE timer of timer pair TIMER C (EXECUTE_C). As described earlier, the implementation of the performance observation control register PERF_MON as disclosed herein ensures that it is possible to control the plurality of observations concurrently by providing the ability to i) write a control value that does not alter the operation (e.g., starting an already started observation), and ii) write a value that does not affect an operation (e.g., a no operation element). These two properties enable an efficient mechanism that allows the control software to easily determine the affected elements by simple rules (e.g., by OR'ing the operations related to de-activating the earlier task with the operations related to activating the new task) without having to handle all corresponding combinations (as an example a watchdog that observes a higher priority task should not affect a watchdog that observes a lower priority task).

Figure 9:
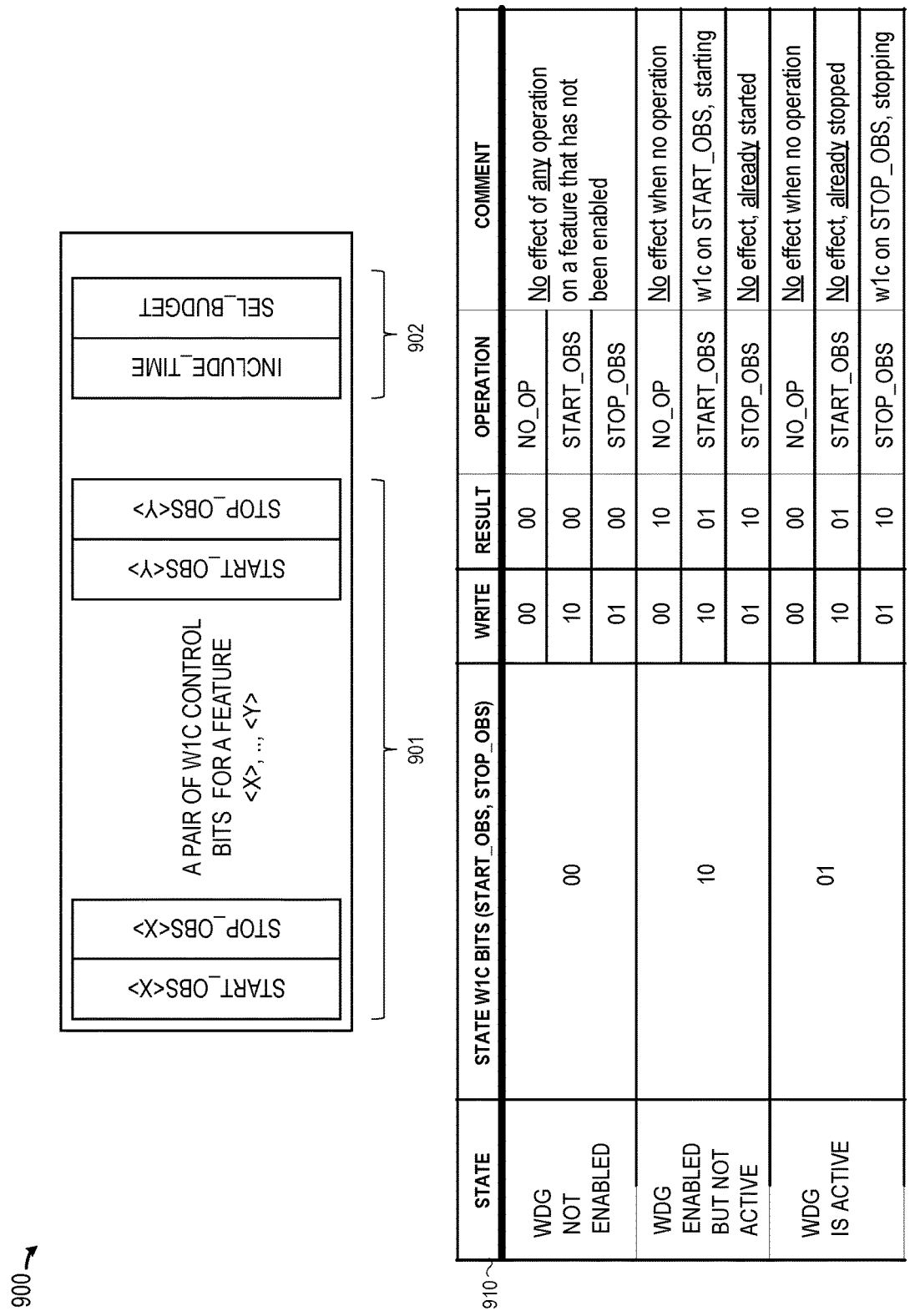
FIG. 9 is a generalized depiction of a performance monitor control register which uses write-1-clear fields to implement the specific combination of timer and watchdog operations in accordance with selected embodiments of the present disclosure.

To provide additional details for an improved understanding of selected embodiments of the present disclosure, reference is now made to FIG. 9 which is a generalized depiction of a performance monitor control register PERF_MON 900 which uses write-1-clear fields to implement the control of specific combination of timer and watchdog operations shown in the table 910. A write-1-clear (W1C) field exhibits a specific behavior of the corresponding register bit, which clears an earlier set bit ("1") only when writing a "1" value, writing a "0" does not affect the earlier value, and an earlier value "0" cannot be altered, neither by writing a "1" nor by writing a "0".

An equivalent implementation could be reached by a write-0-set (W0S) field, which implements an inverse behavior whereby an earlier cleared bit ("0") is set only when writing a "0", while writing a "1" does not affect the earlier cleared bit value, and an earlier "1" cannot be altered. As will be appreciated, utilizing this W0S field type is equivalent when also inverting the corresponding control signals. As such, this register is one embodiment of the performance monitor control register 201 depicted in FIG. 2. Other embodiments may further extend such a register by including one or multiple additional hardware status signals in the logic for generating the control signals (e.g., tmr_enable, STARTOBS, and wdg_enable in FIG. 2) provided by this register to the observation timers and watchdogs. Other embodiments may utilize a different set or a different combination of the described fields. The description of this figure should especially improve the understanding of the specific requirements described in the earlier paragraph, which are essential for an efficient control of a combination of observation features by a minimal amount of register accesses (e.g., a single write operation).

As depicted, the performance monitor control register 900 includes a first set of register interface fields 901 which may be used to store a pair of W1C control bits (e.g., START_OBS<i>, STOP_OBS<i>, i=X . . . Y) for each feature being monitored by the monitoring hardware circuit. In this context, a feature refers to an observation watchdog or an observation/measurement timer or timer pair, and each feature may be implemented by a corresponding hardware circuit or in form of a virtual instance, where multiple such virtual instances are mapped to a single hardware circuit under control of the performance monitor control register PERF_MON (e.g., by saving/loading the corresponding counter circuit value, as this has been described earlier). In addition or in the alternative, the performance monitor control register 900 may include a second set of register interface fields 902 which may be used to store a pair of control bits (e.g., INCLUDE_TIME, SEL_BUDGET) for controlling a measurement timer pair which monitors the execution and stall times of a task. Also, a corresponding pair of control bits may be replicated, or combined with a pair START_OBS<i>,STOP_OBS<i> to control a specific measurement timer pair as described earlier. It will be understood that this figure only depicts an example embodiment of the present disclosure, and other embodiments may select a different combination of control features (e.g., multiple INCLUDE_TIME/SEL_BUDGET fields, or a combination of the INCLUDE_TIME/SEL_BUDGET field with START_OBS/STOP_OBS control fields).

With the W1C control bits in the first set of register interface fields 901, the performance monitor control register PERF_MON 900 may be used to concurrently control multiple features using a single write access operation, thereby avoiding the overhead required for read-modify-write or multiple operations (e.g., when controlling every feature separately). As will be appreciated, the outcome for a write access operation to each pair of W1C control bits (e.g., START_OBS<i>, STOP_OBS<i>) will depend on the existing state of the W1C control bits and the write access values being written thereto. As will be appreciated, the specific combination of a pair of W1C control bits may be selected to control a single feature which includes the properties of i) providing a control value that does not alter the operation, and ii) providing a value that does not affect an operation, which are essential for an efficient control capability.

This dependency relationship is shown in table 910 with reference to the earlier state of a feature (see column "STATE" with the potential feature states "NOT ENABLED", "ACTIVE", and "NOT ACTIVE"; in this case for the example of a watchdog WDG) and the corresponding encoding of the control field values in the column "STATE W1C BITS" (in the shown order of bit fields START_OBS<i>, STOP_OBS<i> for a pair; the pair qualifier <i> is here omitted for the sake of clarity). This column shows the bit field combination when the watchdog timer element WDG is not enabled (when the W1C control bit values are START_OBS=0, STOP_OBS=0). When the W1C control bit fields have the value 10 (START_OBS=1, STOP_OBS=0), then the watchdog timer element WDG is enabled, but not (yet) activated ("NOT ACTIVE"). When the W1C control bit fields have the value 01 (START_OBS=0, STOP_OBS=1), then the watchdog timer element WDG is activated ("ACTIVE"). The W1C control bit field value combination 11 is not possible, due to the concurrent, interlinked operation of these two control bit fields.

As is reflected in the first three columns corresponding to a not (yet) enabled (WDG) feature ("NOT ENABLED") any valid write value to a corresponding feature will not alter the control state of this feature. In this "cleared" or disabled state, any attempt to write update values (WRITE column) to the W1C register fields for a feature will have no effect on the values of the W1C control bits ("RESULT" column) since the watchdog timer element is not enabled. The WRITE column indicates the corresponding write value: "00"=NO_OP [no operation], "10"=START_OBS [request to start an observation], "01"=STOP_OBS [request to stop an observation]. The resulting control state for this feature is indicated by the control bit field value "00" in the column RESULT, which will be in any case a "NOT ENABLED" feature. Even writing an invalid value ("11", not shown in the table) would not alter the control state of this feature; as can be inferred from the definition of a W1C bit field.

In contrast, when the W1C control bit values are "10" (START_OBS=1, STOP_OBS=0), the corresponding feature is enabled, though not active ("NOT ACTIVE"). In this "enabled" state, any attempt to write update values "00" (NO_OP) or "01" (STOP_OBS) (as indicated in the WRITE column) to the W1C register fields for a feature will have no effect on the values of the W1C control bits (as indicated in the "RESULT" column, which after this write access still holds "10"="NOT ACTIVE"). However, writing update values "10" to the W1C register control fields will flip the start bit (START_OBS=1→0) since it is set, thereby starting the feature (in this example the watchdog timer WDG). Simultaneously, the paired stop bit will be flipped (STOP_OBS=0→1), thereby placing the watchdog timer in an "active" state (e.g., START_OBS=0, STOP_OBS=1) to begin measuring the feature. The "RESULT" column for this operation reflects the control state change for the feature, which is then "01" (indicating an "ACTIVE" feature). Due to the definition of a W1C bit field, writing an invalid value ("11", not shown in the table) would be equivalent to writing the value "10".

In the "active" state when the W1C control bit values are "01" (START_OBS=0, STOP_OBS=1), corresponding feature is active (e.g., a timer is actively measuring, or a watchdog is actively observing a software execution). Any attempt to write update values "00" (NO_OP) or "10" (START_OBS) (as indicated in the WRITE column) to the W1C register fields for a feature will have no effect on the values of the W1C control bits (as indicated in the "RESULT" column, which after this write access still "01"="ACTIVE"). However, writing update values "01" to the W1C register control fields will flip the stop bit (STOP_OBS=1→0) since it is set, thereby stopping the feature (in this example the watchdog timer WDG). Simultaneously, the paired start bit will be flipped (START_OBS=0→1), thereby returning the watchdog timer to the "enabled, but not active" state ("NOT ACTIVE"). Due to the definition of a W1C bit field, writing an invalid value ("11", not shown in the table) would be equivalent to writing the value "01".

As seen from the table 910, writing update values "00" (NO_OP) will not affect any features state, thus providing a control value that does not affect the operation ("NO_OP"=no operation). Writing update values "10" will flip the start bit START_OBS when set, and writing update values "01" will flip the stop bit STOP_OBS when set. Writing an alternate control bit value "10" (in case of an "ACTIVE" control state, indicated by a "01" value) or "01" (in case of an "NOT ACTIVE" control state, indicated by a "10" value) does not alter the operation. In particular, an "ACTIVE" control state must not change when started again, and a "NOT ACTIVE" control state must not change when stopped again. As seen from the foregoing, only a feature having equivalent control bits START_OBS/STOP_OBS to the write value will change its control state after the write access, and any other write value will have no impact on the control state of a feature. This behavior implements exactly the functionality identified as required for an optimal support for concurrently switching the control state of multiple features.

In addition or in the alternative, the second set of register interface fields 902 in the performance monitor control register 900 can also be used to store a pair of control bits) for controlling a single timer pair which measures the execution state (e.g., execute and stall time) of a task, an subsection of a software application or an interrupt service routine. In selected embodiments, there may be multiple timer pairs being controlled by multiple control bit pairs (e.g., INCLUDE_TIME<k>, SEL_BUDGET<k>), each controlling control bit pair controlling a single timer pair (as shown in FIG. 5). In selected embodiments, a single timer pair may be used to emulate multiple timer pairs by selecting a timer pair for measuring multiple features, and then sequentially loading/storing time measurement information for each feature to the selected timer pair using a background DMA process to write collected runtime performance data to the selected timer pair under software control. This set of control bits permits direct control of the control state of a feature, but does not provide a write value that does not affect the current operation (which may be desirable for a certain subset of observation features).

In selected embodiments, a timer may be controlled by a START_OBS/STOP_OBS control bit pair to also provide a NO_OP write value, or multiple timer pairs may be controlled by a combination of such control bits in combination with the earlier described pair of control bits (e.g., INCLUDE_TIME, SEL_BUDGET). Such a combination provides the earlier described benefits, but also permits a direct control of a corresponding observation timer (when it is selected by the START_OBS/STOP_OBS control state). In selected embodiments a corresponding set of control fields may be further combined with a hardware status signal to measure the software execution in relation to the hardware status by a timer pair.

By now it should be appreciated that there has been provided an apparatus, method, program code, and system for collecting runtime performance data with an integrated circuit which includes a central processing unit (CPU), a memory configured for storing data and CPU-executable instructions, a timer block bank, and a single performance monitor control register, all communicatively coupled and connected together with one or more communication busses. In particular, the timer block bank includes a plurality of timer instances which are selectively activated to collect runtime performance data during execution of application code by measuring specified software execution events. In selected embodiments, each of the timer instances is independently set up by the CPU to measure an execution and/or stall time behavior for specified software execution events by writing into a timer control register associated with said timer instance. In other embodiments, each of the timer instances may be selected to be activated by writing to the single performance monitor control register providing hardware signals for controlling said timer instance or during set up of said timer instance by writing into the timer control register associated with said timer instance, wherein the activation may be limited to timer instances that are correctly set up and may comprise a restart of the timer instance. In addition, the single performance monitor control register includes a plurality of register fields for independently controlling activation behavior of the plurality of timer instances in response to a single write operation to the performance monitor control register. In selected embodiments, each of the timer instances may be configured by the CPU to be activated or deactivated or keep a current state by writing into the plurality of register fields of the single performance monitor control register with a single write operation. In addition, the plurality of register fields of the single performance monitor control register may be embodied with one or more pairs of write-1-clear (W1C) control register fields, wherein a successful clear operation of a first write-1-clear control register field in a pair sets the other write-1-clear control register field of the said pair. Using the timer block and performance monitor control register, each timer instance may be selectively activated by a corresponding register field in the single performance monitor control register to measure software execution events by providing at least one of: a first observation of a first execution budget for the software execution; a second observation of a second execution budget corresponding to an execution status for the software execution; a third observation of a time budget for an execution status of a hardware resource or software resource used by the software execution; and/or a first measurement of a first execution status of a first task that is currently running, a second task that is not running, or an interrupt service routine. In such embodiments, each timer instance may be operable to provide a notification to software when an execution or time budget is reached or exceeded or when a measurement reaches a predefined value. In addition, each timer instance in such embodiments may be operable upon starting an observation to perform one of the following operations: reloading a budget value defining an execution or timer budget to be observed; continuing an observation using a previous value for this observation; or loading a start value to start a new measurement; wherein the operation is selected upon timer instance setup by a selection value written to a timer control register associated with said timer instance. In selected embodiments, a single write operation to the performance monitor control register may modify a set of control fields in the single performance monitor control register comprising one or more control bits used to generate control signals for one or more timer instances in the timer bank. In such embodiments, the activation behavior of a timer instance may be directly determined from the set of control fields in the single performance monitor control register. In addition or in the alternative, the activation behavior of a timer instance may be determined by modification of the set of control fields in the single performance monitor control register and a previous value of control bits in said control fields. In selected embodiments, a single write access to all of the plurality of register fields of the single performance monitor control register is operable to specify one of the following activation behaviors: starting an observation by a specific timer instance; terminating an observation by a specific timer instance; or performing no modification of a current state of a specific timer instance by either: a write value for a register field, or the combination of the write value for a register field with a previous value of the register field.

In another form, there is provided an apparatus, method, program code, and system for collecting runtime performance data with a set of hardware timers under control of a dedicated hardware control register. In the disclosed methodology, one or more first trigger events are detected during execution of application code. In response to the one or more first trigger events, a first access is performed to a dedicated hardware control register that modifies one or more first control fields that control a first set of hardware timers. In response to the first access, one or more first hardware timers is activated to perform an observation or measurement corresponding to the one or more first trigger events. In selected embodiments, the step of activating observation or measurement may include starting or restarting a new observation or measurement or continuing an earlier observation or measurement by the one or more first hardware timers. While each of the one or more first hardware timers performs a corresponding observation or measurement, software execution is performed until one or more second trigger events is detected during execution of application code. In response to the one or more second trigger events, a second access is performed to the dedicated hardware control register that modifies one or more second control fields that control a second set of hardware timers. In selected embodiments, a second hardware timer in the second set of hardware timers is activated in response to the second access to perform an additional observation or measurement while performing a further software execution after detecting the one or more second trigger events. And in other embodiments where a third hardware timer in the first set of hardware timers already performs a third observation or measurement of an earlier software execution while the one or more first trigger events is detected, the third hardware timer may the third observation or measurement in response to the first access. In response to the second access, the observation or measurement by the one or more first hardware timers is deactivated. In the disclosed methodology, each hardware timer in the first and second sets of hardware timers is operable to be activated or deactivated by control signals generated from, or upon accesses to, control fields in the dedicated hardware control register. In selected embodiments of the disclosed methodology, each hardware timer in the first and second sets of hardware timers may be independently controlled by the first and second accesses to the dedicated hardware control register. In other embodiments, each of the one or more first hardware timers may provide a notification to software when an execution or time budget is reached or exceeded while the one or more first hardware timers is activated. In other embodiments, the one or more first hardware timers may be configured independently from other hardware timers in the set of hardware timers by specifying setup information with a write access to a timer control register associated with each of the one or more first hardware timers. In such embodiments, an execution budget or time budget for the observation or measurement by the one or more first hardware timers may be specified by or as part of the setup information. In other embodiments, the observation or measurement by the one or more first hardware timers may be activated or deactivated in response to one or more bits of a control field in the dedicated hardware control register associated with the one or more first hardware timers or in response to a change of one or more bits of the control field in the dedicated hardware control register associated with the one or more first hardware timers.

Although the described exemplary embodiments disclosed herein are directed to runtime performance data collection methods and systems which may be applied to provide timing protection mechanisms for detecting timing faults, such as may be used with the AUTOSAR standards, the present invention is not necessarily limited to the example embodiments illustrate herein, and various embodiments of the circuitry and methods disclosed herein may be implemented with other devices and circuit components. For example, various embodiments may use the techniques for collecting runtime performance data to steer the loading process and/or guide cache replacement algorithms used to keep the most previous load units in on-board memory, thereby reducing the cost and complexity of providing larger on-board memory. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
a central processing unit (CPU);
a memory configured for storing data and CPU-executable instructions;
a timer block bank comprising a plurality of timer instances which are selectively activated to collect runtime performance data during execution of application code by measuring specified software execution events;
a single performance monitor control register comprising a plurality of register fields for independently controlling activation behavior of the plurality of timer instances in response to a single write operation to the performance monitor control register; and
one or more communication busses connected to communicatively couple the CPU, the memory, the timer block bank, and the performance monitor control register.

2. The integrated circuit of claim 1, wherein each of the plurality of timer instances is independently set up by the CPU to measure an execution and/or stall time behavior for specified software execution events by writing into a timer control register associated with said timer instance.

3. The integrated circuit of claim 1, wherein each of the plurality of timer instances is selected to be activated by writing to the single performance monitor control register providing hardware signals for controlling said timer instance or during set up of said timer instance by writing into the timer control register associated with said timer instance, wherein the activation may be limited to timer instances that are correctly set up and may comprise a restart of the timer instance.

4. The integrated circuit of claim 1, wherein each of the plurality of timer instances is configured by the CPU to be activated or deactivated or keep a current state by writing into the plurality of register fields of the single performance monitor control register with a single write operation.

5. The integrated circuit of claim 1, wherein the plurality of register fields of the single performance monitor control register comprises one or more pairs of write-1-clear (W1C) control register fields, wherein a successful clear operation of a first write-1-clear control register field in a pair sets the other write-1-clear control register field of the said pair.

6. The integrated circuit of claim 1, wherein each timer instance may be selectively activated by a corresponding register field in the single performance monitor control register to measure software execution events by providing at least one of:
a first observation of a first execution budget for the software execution;
a second observation of a second execution budget corresponding to an execution status for the software execution;
a third observation of a time budget for an execution status of a hardware resource or software resource used by the software execution; and/or
a first measurement of a first execution status of a first task that is currently running, a second task that is not running, or an interrupt service routine.

7. The integrated circuit of claim 6, wherein each timer instance is operable to provide a notification to software when an execution or time budget is reached or exceeded or when a measurement reaches a predefined value.

8. The integrated circuit of claim 6, wherein each timer instance is operable upon starting an observation to perform one of the following operations:
reloading a budget value defining an execution or timer budget to be observed;
continuing an observation using a previous value for this observation; or
loading a start value to start a new measurement;
wherein the operation is selected upon timer instance setup by a selection value written to a timer control register associated with said timer instance.

9. The integrated circuit of claim 1, wherein a single write operation to the performance monitor control register modifies a set of control fields in the single performance monitor control register comprising one or more control bits used to generate control signals for one or more timer instances in the timer bank.

10. The integrated circuit of claim 9, wherein the activation behavior of a timer instance is directly determined from the set of control fields in the single performance monitor control register.

11. The integrated circuit of claim 9, wherein the activation behavior of a timer instance is determined by modification of the set of control fields in the single performance monitor control register and a previous value of control bits in said control fields.

12. The integrated circuit of claim 1, wherein a single write access to all of the plurality of register fields of the single performance monitor control register is operable to specify one of the following activation behaviors:
starting an observation by a specific timer instance;
terminating an observation by a specific timer instance; or
performing no modification of a current state of a specific timer instance by either:
a write value for a register field, or
the combination of the write value for a register field with a previous value of the register field.

13. A method for collecting runtime performance data with a set of hardware timers under control of a dedicated hardware control register, comprising:
- detecting one or more first trigger events during execution of application code;
- performing, in response to the one or more first trigger events, a first access to a dedicated hardware control register that modifies one or more first control fields that control a first set of hardware timers;
- activating, in response to the first access, an observation or measurement by one or more first hardware timers corresponding to the one or more first trigger events;
- performing a software execution while each of the one or more first hardware timers performs a corresponding observation or measurement;
- detecting one or more second trigger events during execution of application code;
- performing, in response to the one or more second trigger events, a second access to the dedicated hardware control register that modifies one or more second control fields that control a second set of hardware timers; and
- deactivating, in response to the second access, the observation or measurement by the one or more first hardware timers,
- wherein each hardware timer in the first and second sets of hardware timers is operable to be activated or deactivated by control signals generated from, or upon accesses to, control fields in the dedicated hardware control register.

14. The method of claim 13, where, in response to the second access, a second hardware timer in the second set of hardware timers is activated to perform an additional observation or measurement while performing a further software execution after detecting the one or more second trigger events.

15. The method of claim 13, where a third hardware timer in the first set of hardware timers already performs a third observation or measurement of an earlier software execution while the one or more first trigger events is detected, and where the third hardware timer deactivates, in response to the first access, the third observation or measurement.

16. The method of claim 13, where activating the observation or measurement comprises starting or restarting a new observation or measurement or continuing an earlier observation or measurement by the one or more first hardware timers.

17. The method of claim 13, where each hardware timer in the first and second sets of hardware timers is independently controlled by the first and second accesses to the dedicated hardware control register.

18. The method of claim 13, further comprising providing a notification to software by the one or more first hardware timers when an execution or time budget is reached or exceeded while the one or more first hardware timers is activated.

19. The method of claim 13, further comprising configuring the one or more first hardware timers independently from other hardware timers in the set of hardware timers by specifying setup information with a write access to a timer control register associated with each of the one or more first hardware timers.

20. The method of claim 19, where an execution budget or time budget for the observation or measurement by the one or more first hardware timers is specified by or as part of the setup information.

21. The method of claim 13, where the observation or measurement by the one or more first hardware timers is activated or deactivated in response to one or more bits of a control field in the dedicated hardware control register associated with the one or more first hardware timers or in response to a change of one or more bits of the control field in the dedicated hardware control register associated with the one or more first hardware timers.

* * * * *